US012796472B2

(12) United States Patent
Yu et al.

(10) Patent No.: US 12,796,472 B2
(45) Date of Patent: Nov. 10, 2026

(54) PACKAGE STRUCTURE, PACKAGE-ON-PACKAGE STRUCTURE, AND MANUFACTURING METHOD OF INTEGRATED FAN-OUT PACKAGE

(71) Applicant: Taiwan Semiconductor Manufacturing Company, Ltd., Hsinchu (TW)

(72) Inventors: Tsung-Yuan Yu, Taipei City (TW); Hao-Yi Tsai, Hsinchu City (TW); Tzuan-Horng Liu, Taoyuan City (TW); Yen-Liang Lin, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 607 days.

(21) Appl. No.: 18/173,039

(22) Filed: Feb. 22, 2023

(65) Prior Publication Data

US 2024/0282721 A1 Aug. 22, 2024

(51) Int. Cl.

| | |
|---|---|
| ***H10W 90/00*** | (2026.01) |
| ***H10W 42/00*** | (2026.01) |
| ***H10W 70/05*** | (2026.01) |
| ***H10W 70/60*** | (2026.01) |
| ***H10W 70/685*** | (2026.01) |

(Continued)

(52) U.S. Cl.

CPC ........... *H10W 42/00* (2026.01); *H10W 70/05* (2026.01); *H10W 70/611* (2026.01); *H10W 70/685* (2026.01); *H10W 74/019* (2026.01); *H10W 74/117* (2026.01); *H10W 90/00* (2026.01); *H10W 90/401* (2026.01); *H10W 90/701* (2026.01); *H10W 74/15* (2026.01); *H10W 90/724* (2026.01); *H10W 90/734* (2026.01)

(58) Field of Classification Search

CPC ............... H01L 23/585; H01L 23/5383; H01L 23/5385; H01L 23/5389; H01L 2224/023; H01L 2224/02331; H01L 2224/02373; H01L 2224/02375; H01L 2224/02381; H01L 2225/06503; H10W 70/05; H10W 90/401; H10W 90/701; H10W 90/724; H10W 90/734; H10W 90/754

See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |

(Continued)

*Primary Examiner* — Reema Patel
(74) *Attorney, Agent, or Firm* — JCIPRNET

(57) ABSTRACT

A package structure includes a first package. The first package has an active region and a peripheral region surrounding the active region. The first package includes a first redistribution structure, a second redistribution structure, a die, an encapsulant, and a seal ring structure. The second redistribution structure is disposed over the first redistribution structure. The die is disposed in the active region and is located between the first redistribution structure and the second redistribution structure. The encapsulant laterally encapsulates the die. The seal ring structure is disposed in the peripheral region. A first portion of the seal ring structure is embedded in the first redistribution structure, and a second portion of the seal ring structure is embedded in the second redistribution structure.

20 Claims, 24 Drawing Sheets

(51) Int. Cl.

| | |
|---|---|
| ***H10W 74/01*** | (2026.01) |
| ***H10W 74/10*** | (2026.01) |
| *H10W 74/15* | (2026.01) |

(56) References Cited

U.S. PATENT DOCUMENTS

| | | | | |
|---|---|---|---|---|
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2017/0110421 | A1* | 4/2017 | Liu | H01L 25/50 |
| 2018/0315723 | A1* | 11/2018 | Singh | H01L 24/06 |
| 2019/0051622 | A1* | 2/2019 | Chen | H10W 42/00 |

* cited by examiner

PACKAGE STRUCTURE, PACKAGE-ON-PACKAGE STRUCTURE, AND MANUFACTURING METHOD OF INTEGRATED FAN-OUT PACKAGE

BACKGROUND

The semiconductor industry has experienced rapid growth due to continuous improvements in the integration density of various electronic components (i.e., transistors, diodes, resistors, capacitors, etc.). For the most part, the improvement in integration density has come from repeated reductions in minimum feature size, which allows more of the smaller components to be integrated into a given area. These smaller electronic components also require smaller packages that utilize less area than previous packages. Currently, integrated fan-out packages and package-on-package structures are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
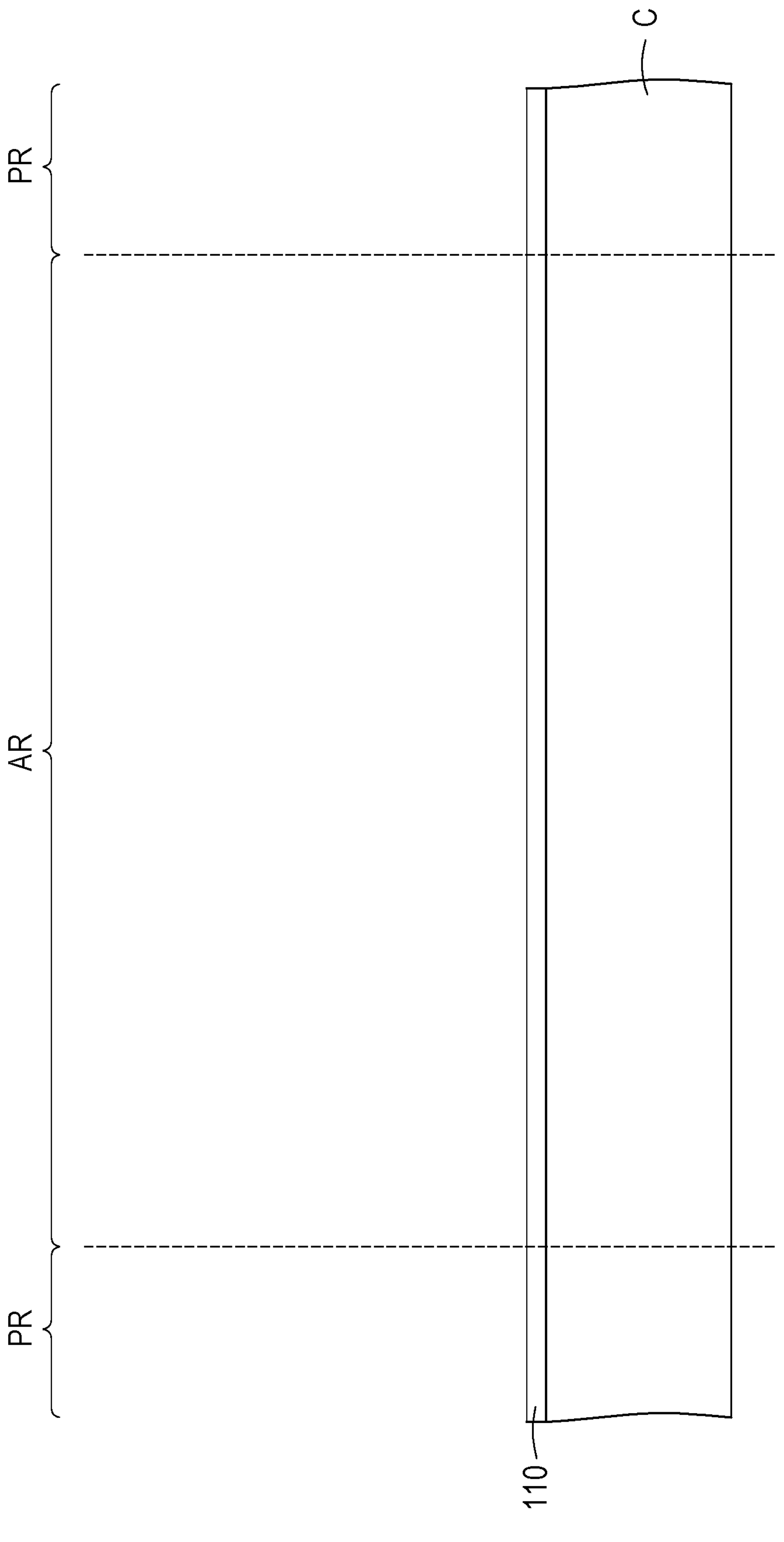
FIG. 1A to FIG. 1O are schematic cross-sectional views illustrating a manufacturing process of a package-on-package (PoP) structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be noted that the features described below may be employed in various packages, such as chip on wafer on substrate (CoWoS) packages, integrated fan-out (InFO) packages, wafer level chip scale package (WLCSP), system on integrated chip (SoIC) packages, multi-chip packages (MCP), package-on-package (POP), and the like. Throughout the entire disclosure, an InFO package and a PoP will be used to explain the spirit of the disclosure, and the disclosure is not limited thereto.

Figure 1B:
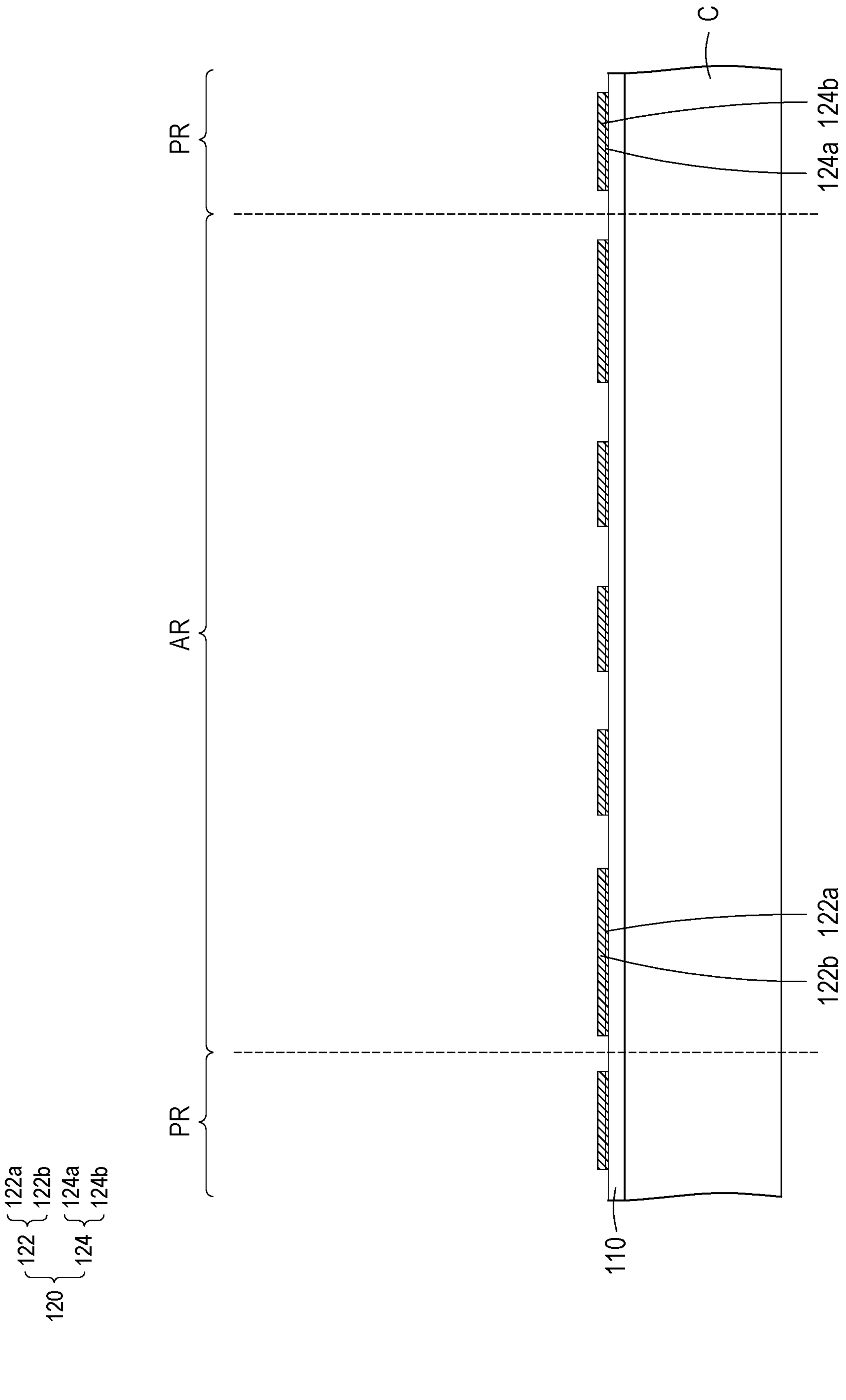
Figure 1C:
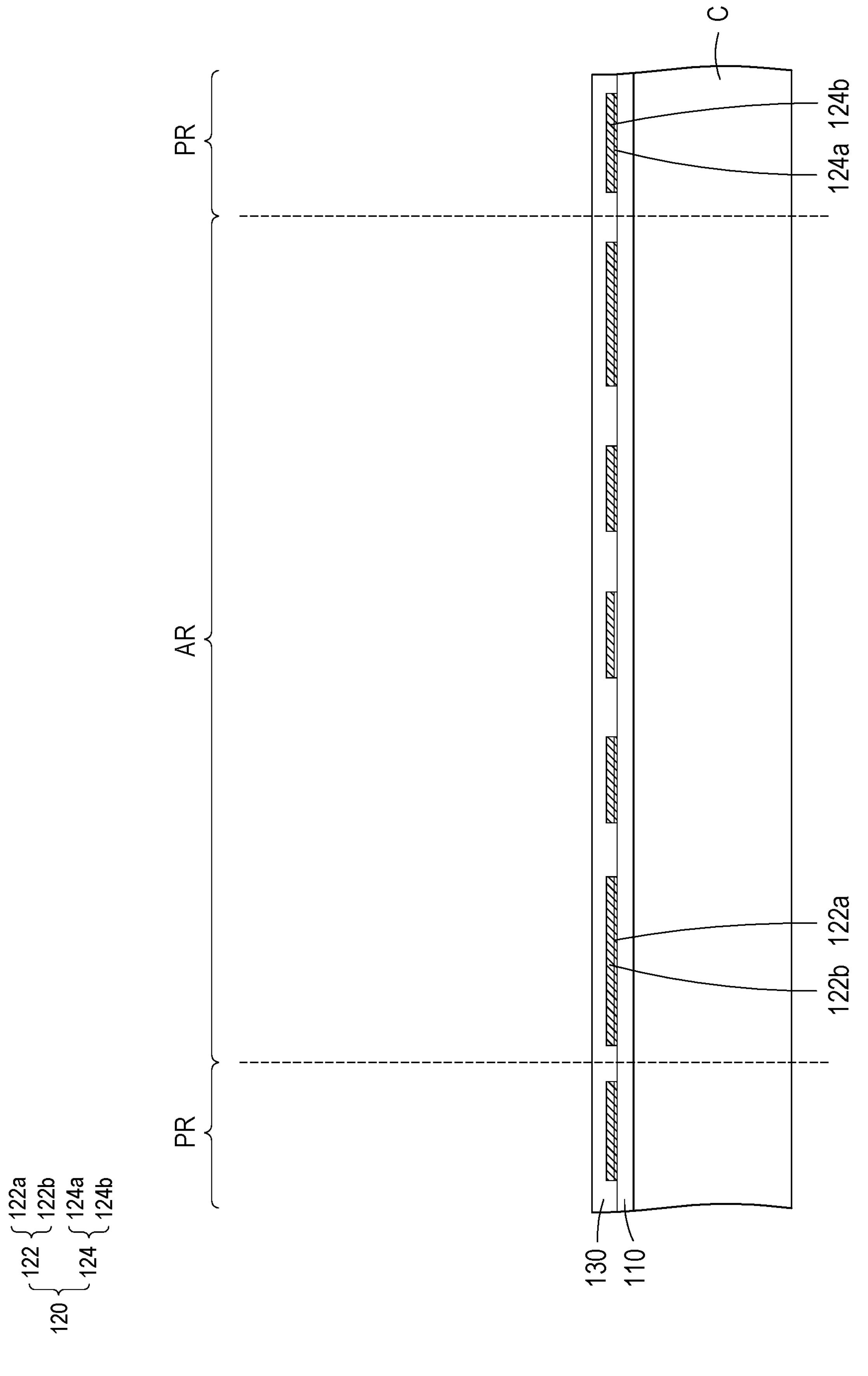
Figure 1D:
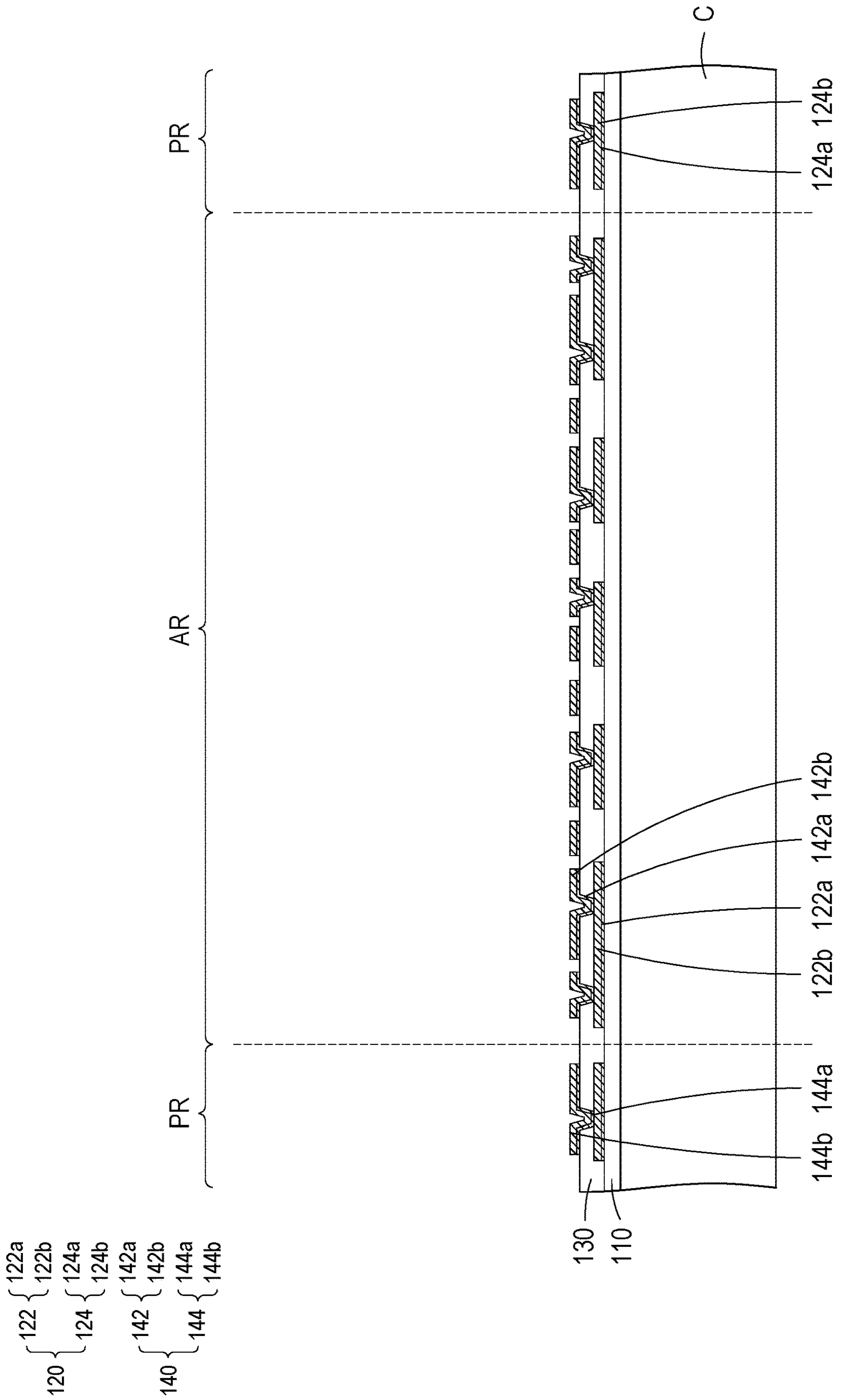
Figure 1E:
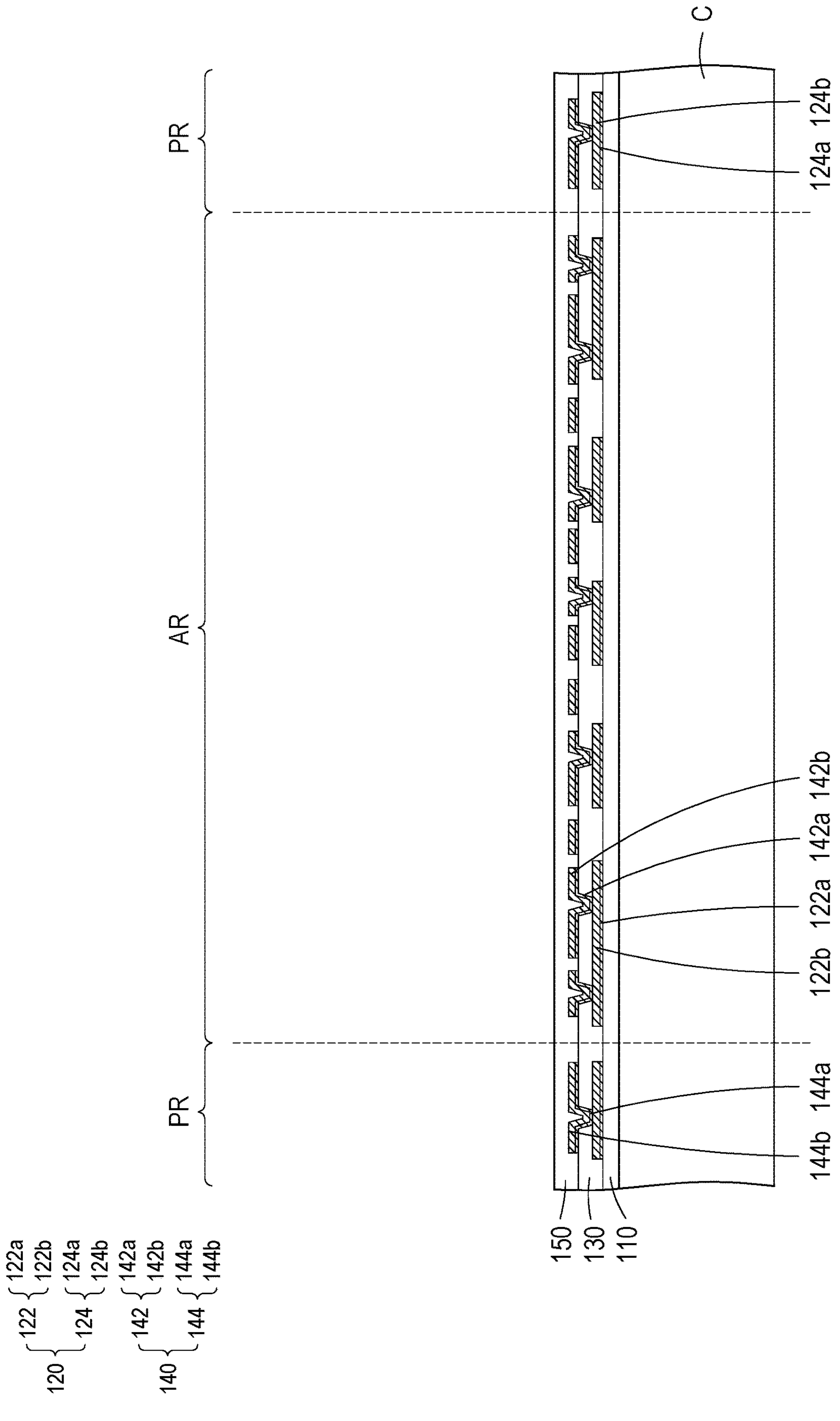
Figure 1F:
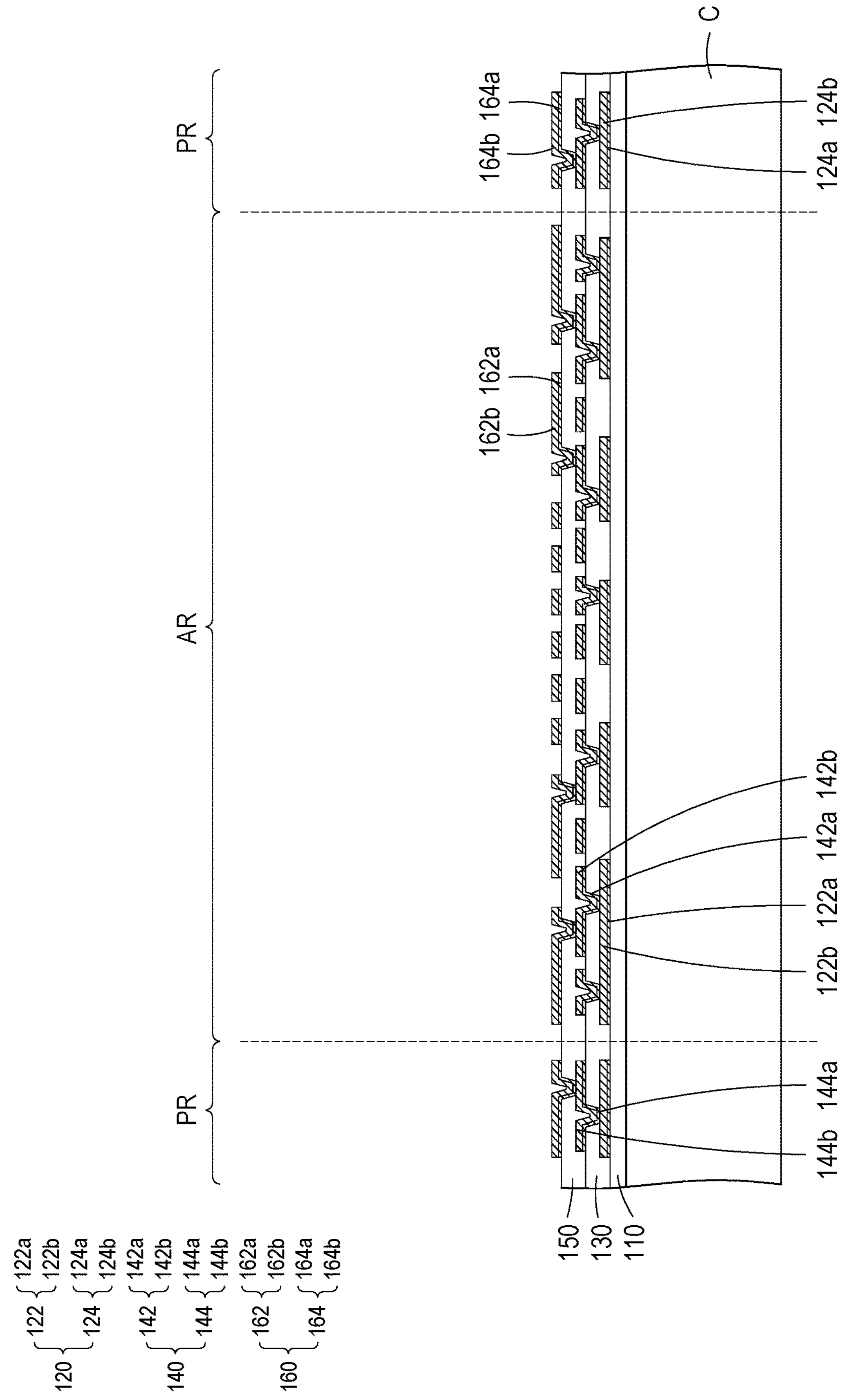
Figure 1G:
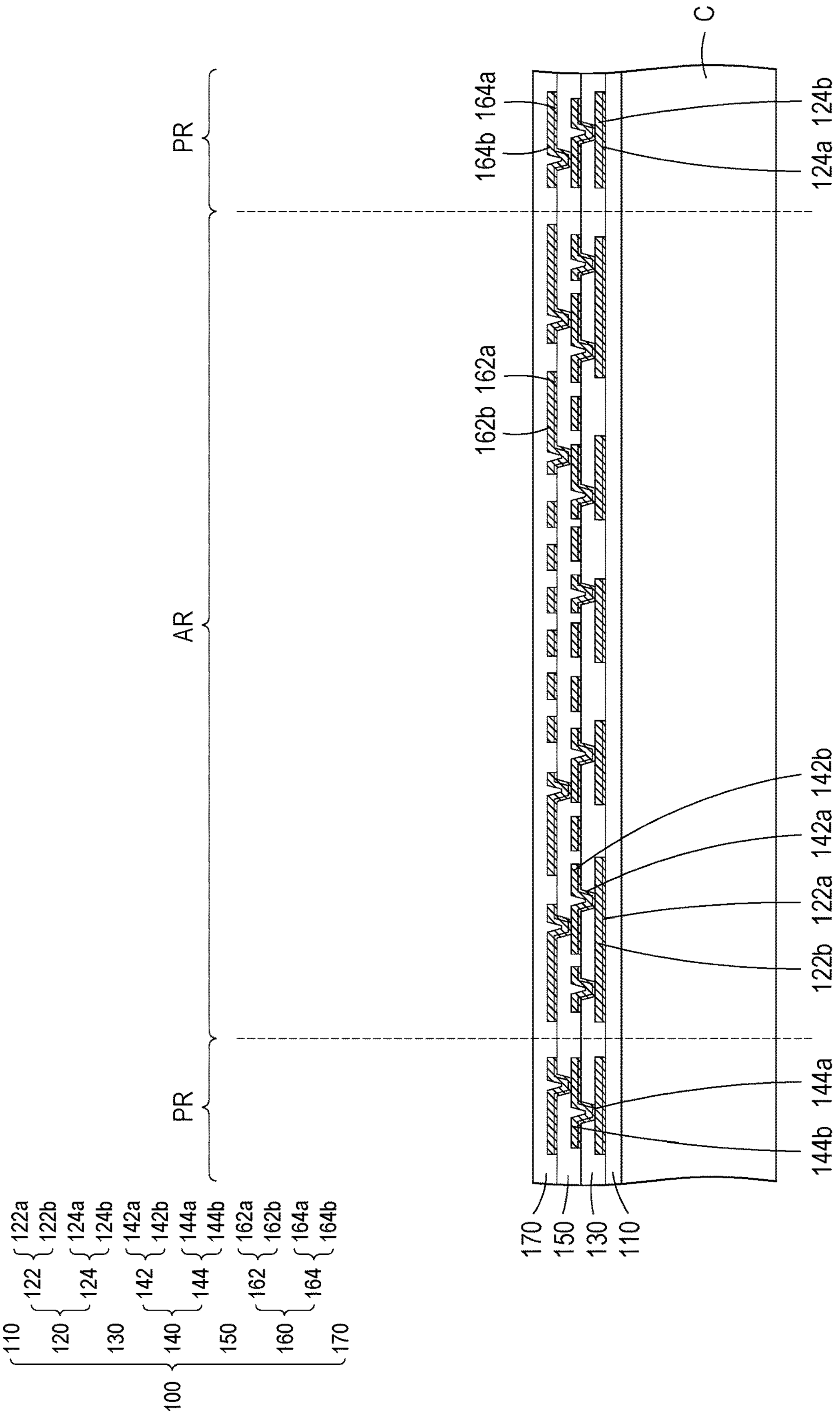
Figure 1H:
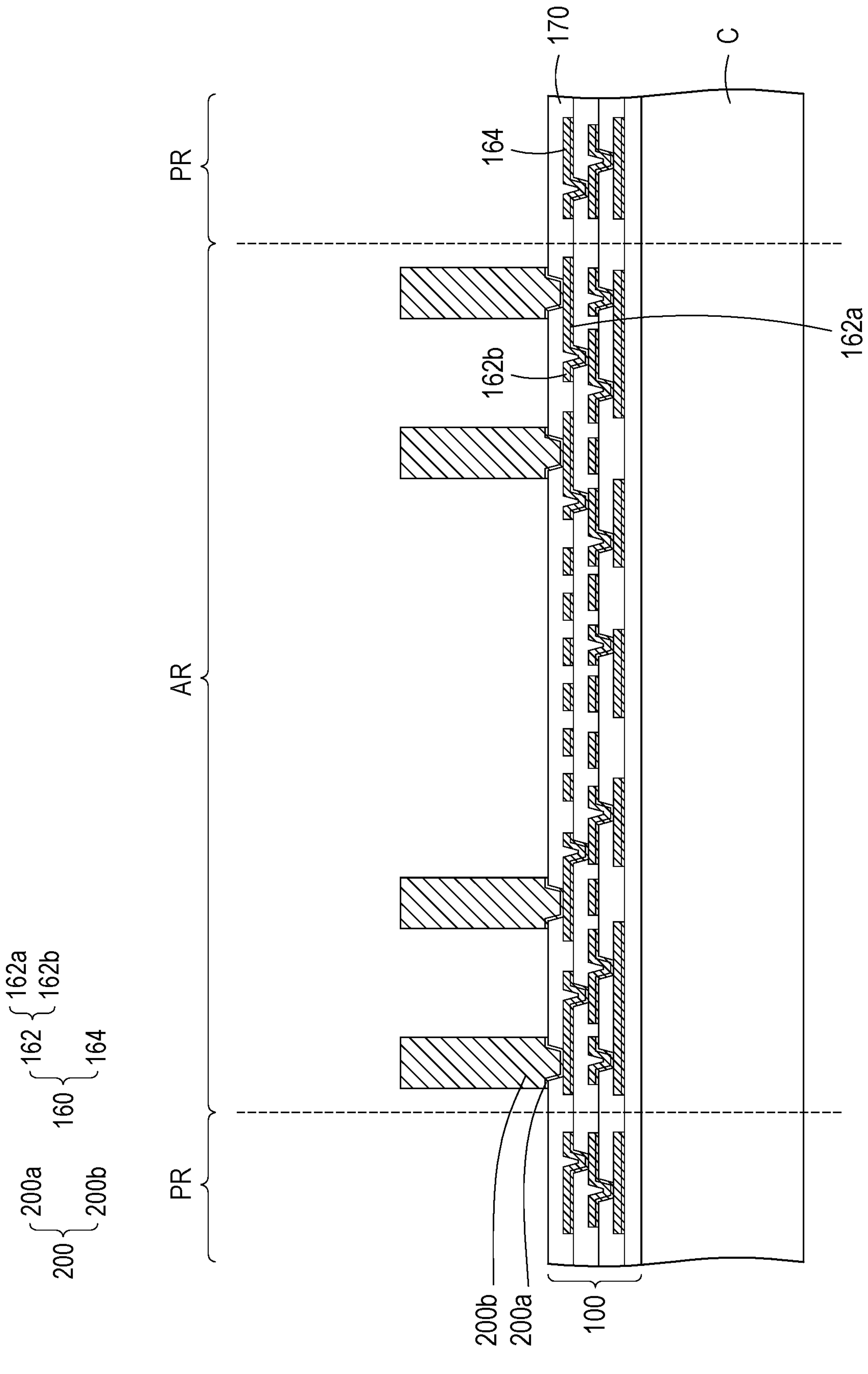
Figure 1I:
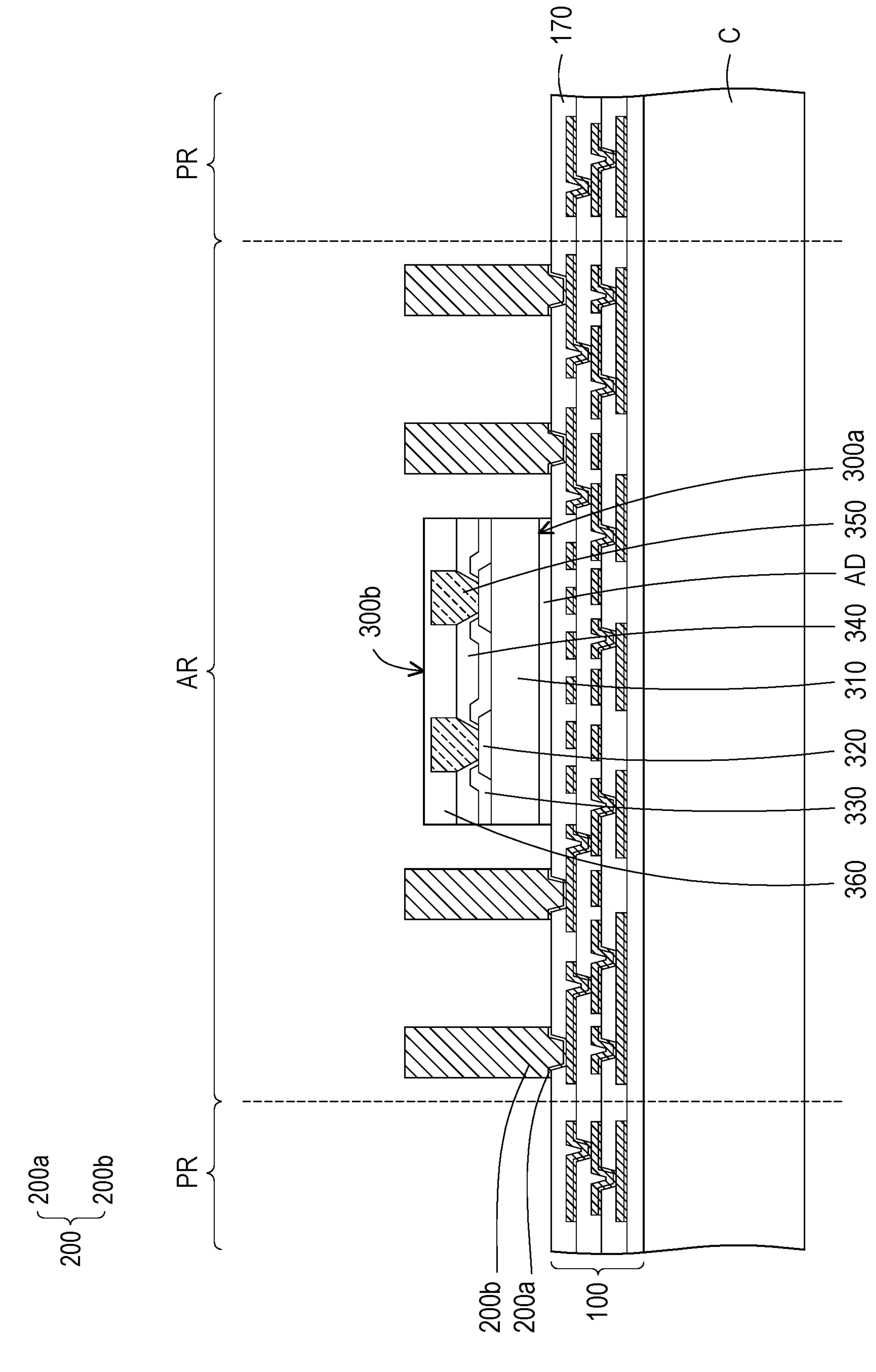
Figure 1J:
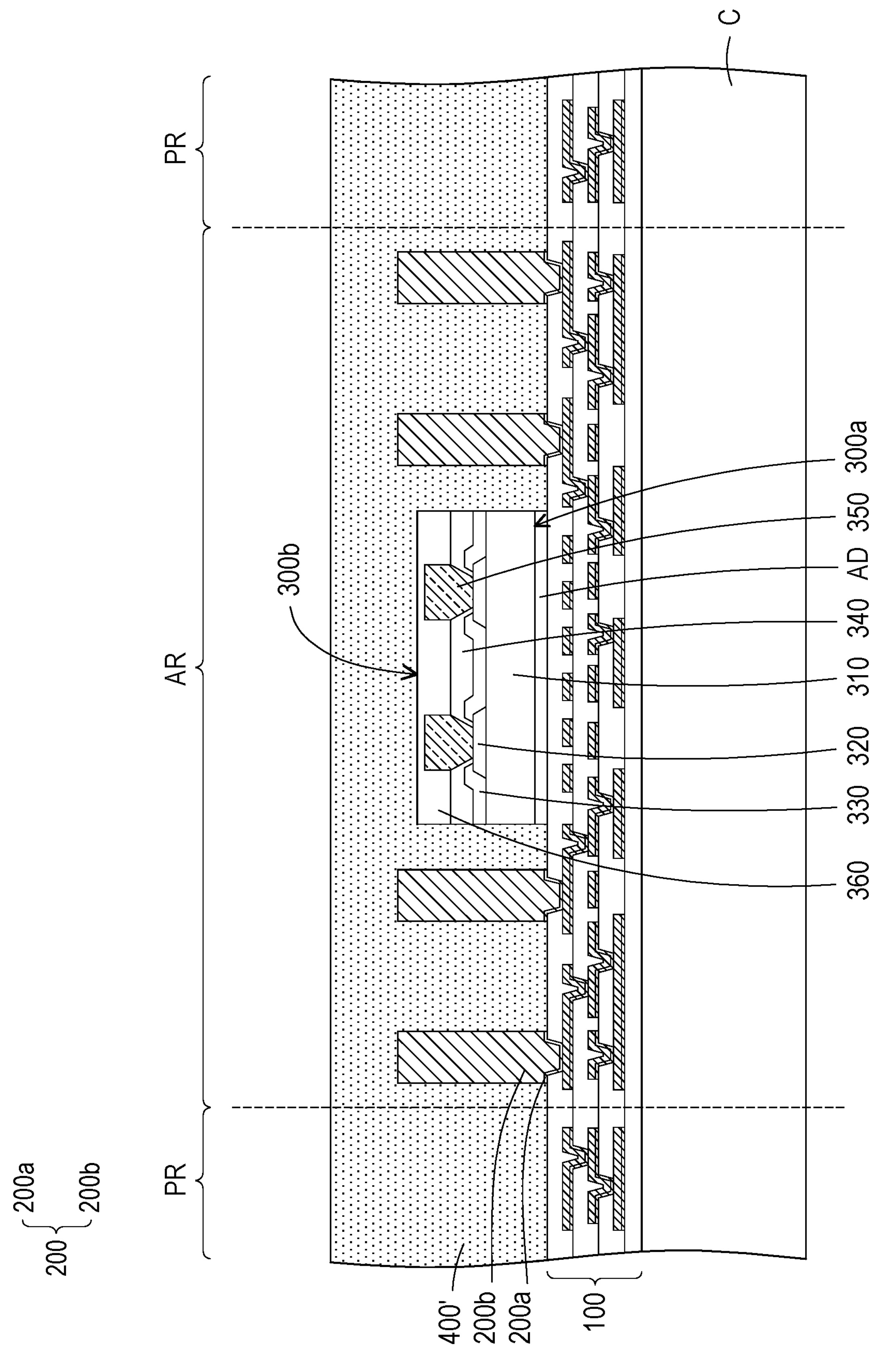
Figure 1K:
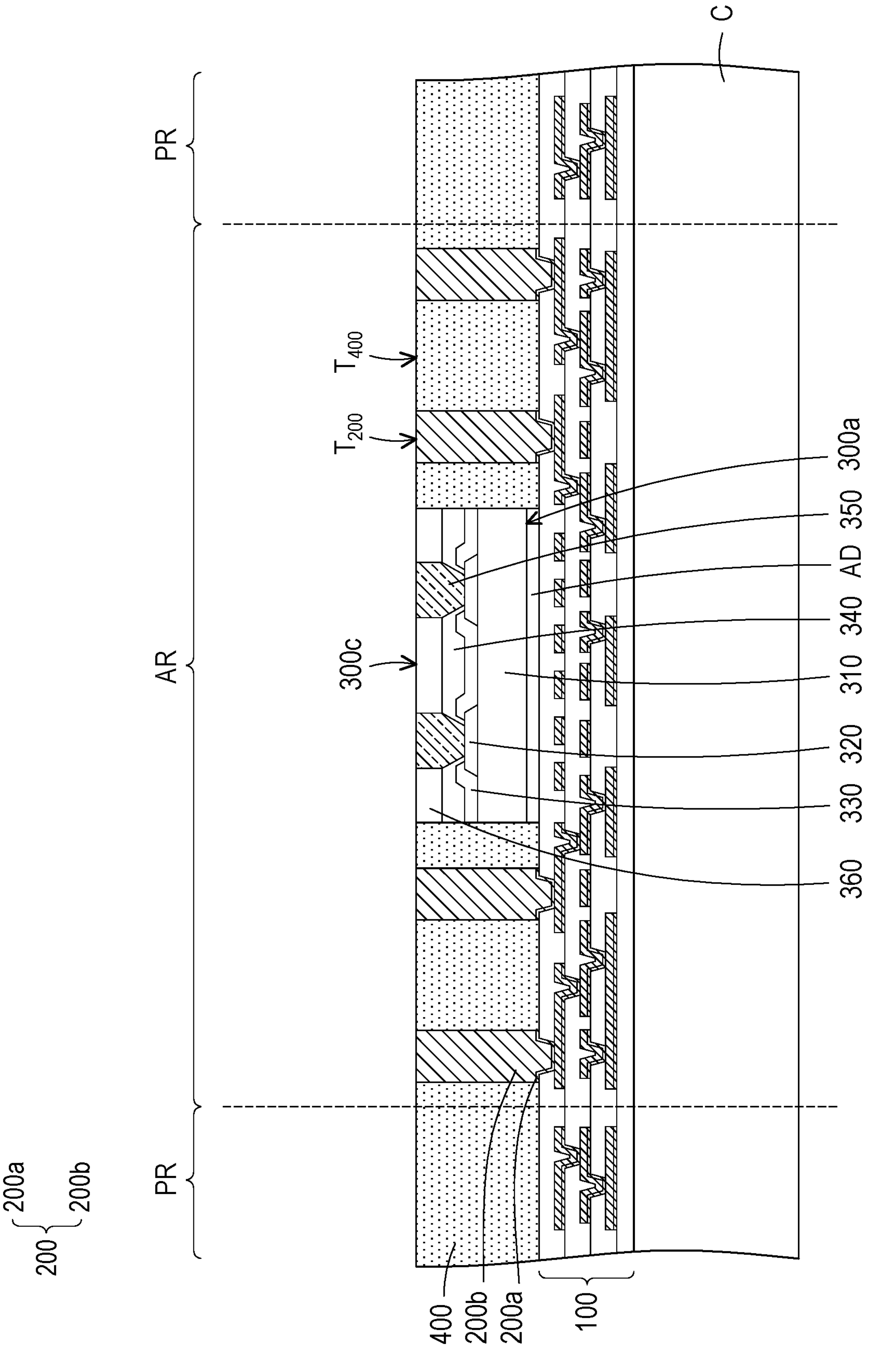
Figure 1L:
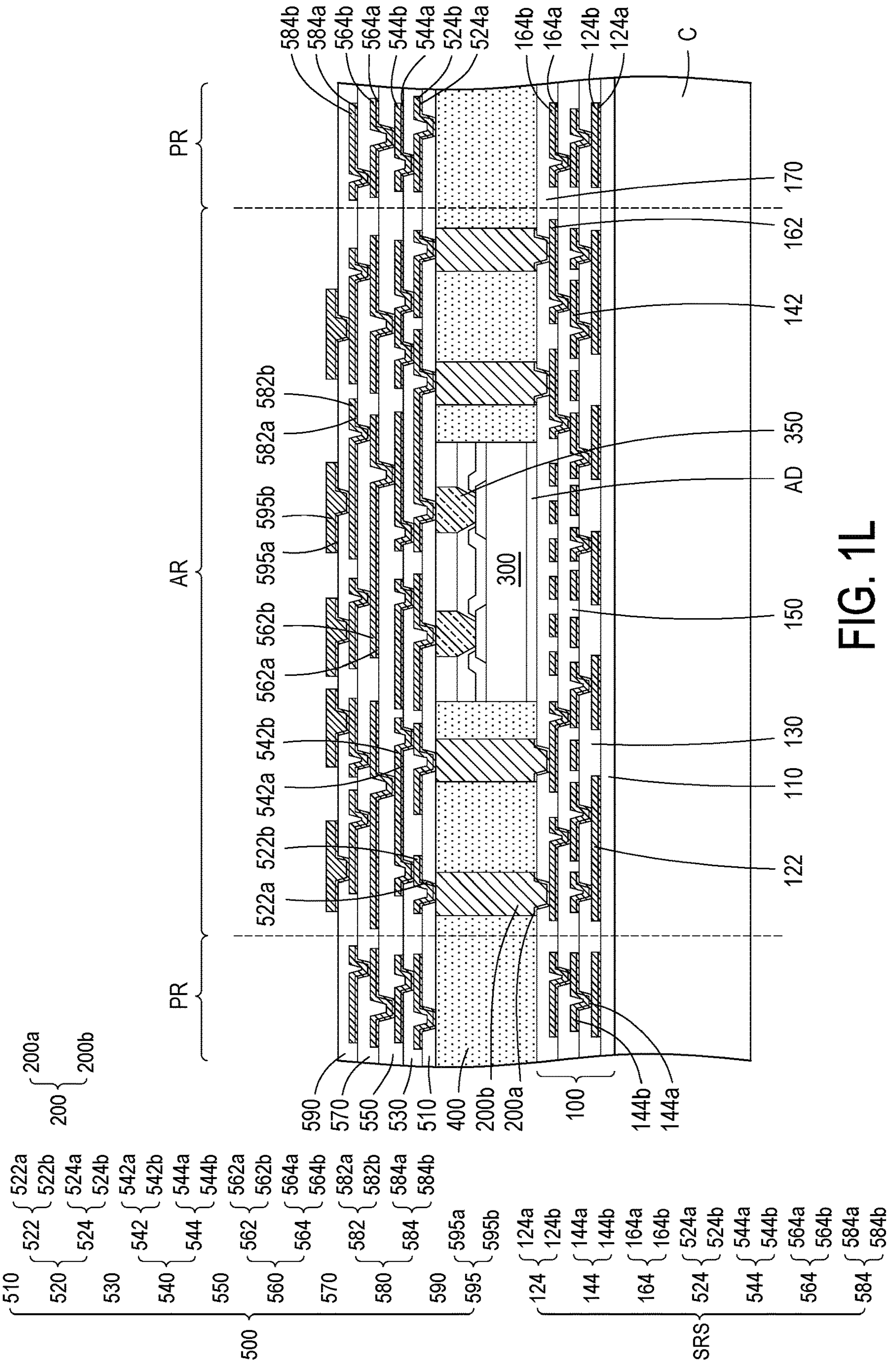
Figure 1M:
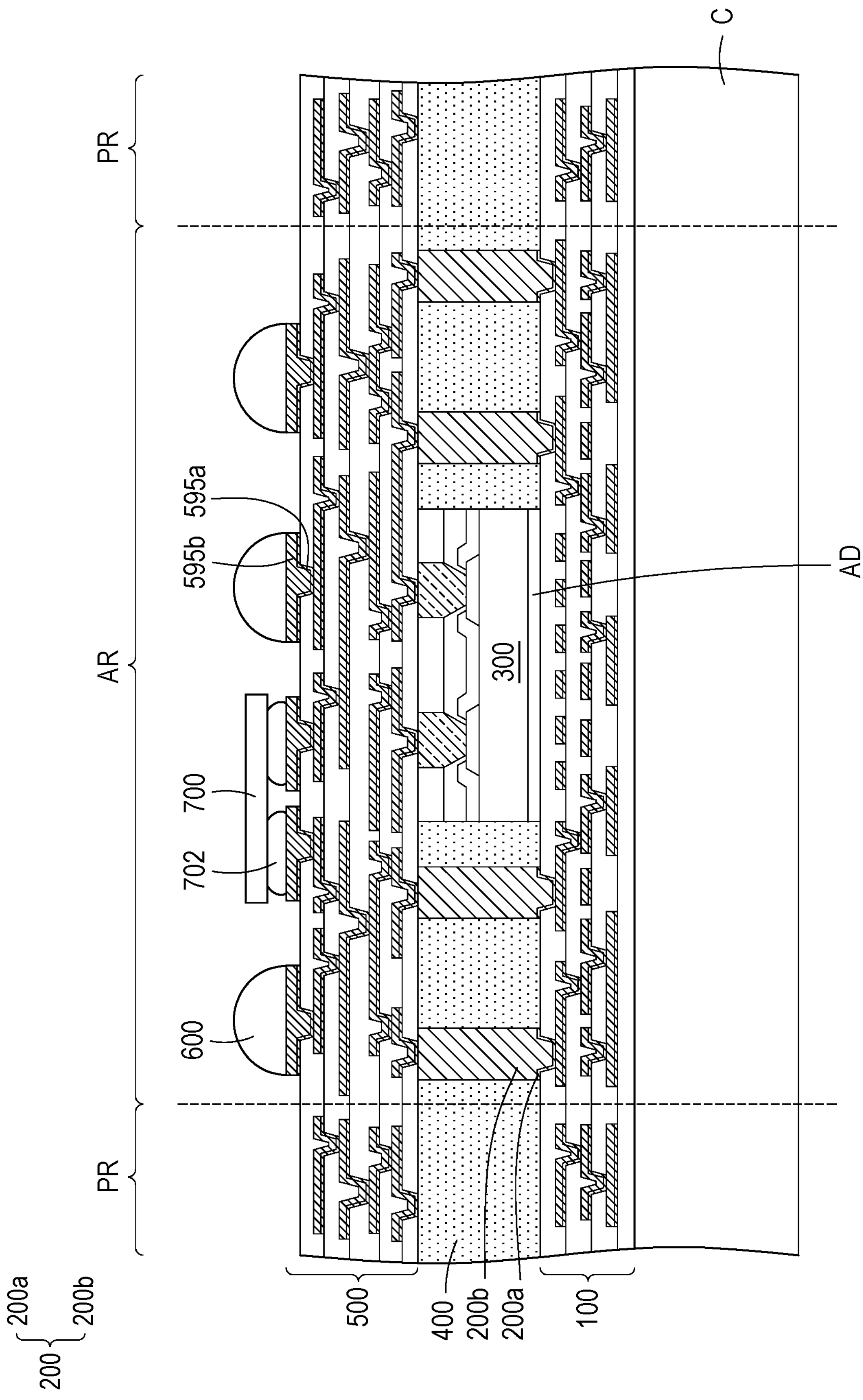
Figure 1N:
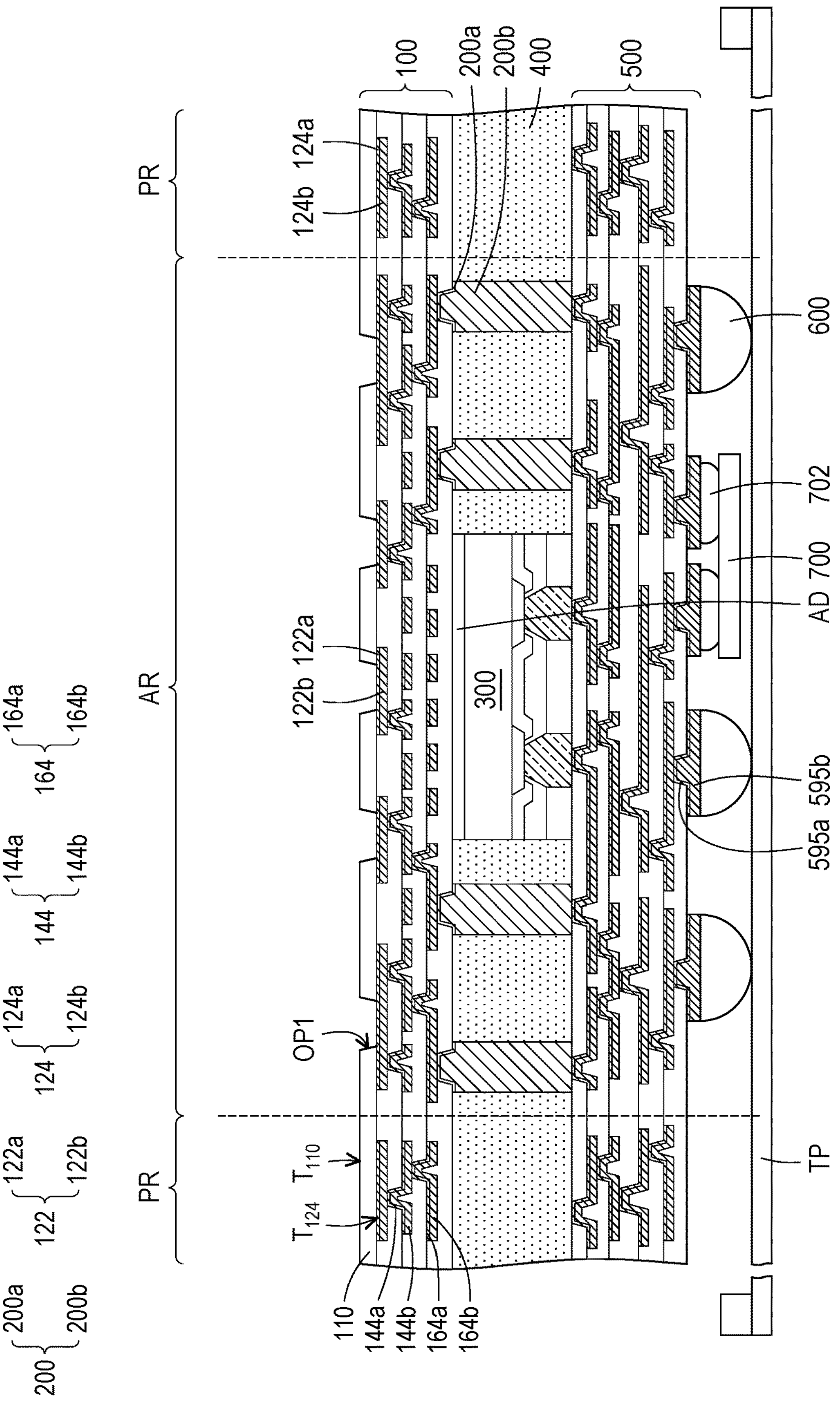
Figure 1O:
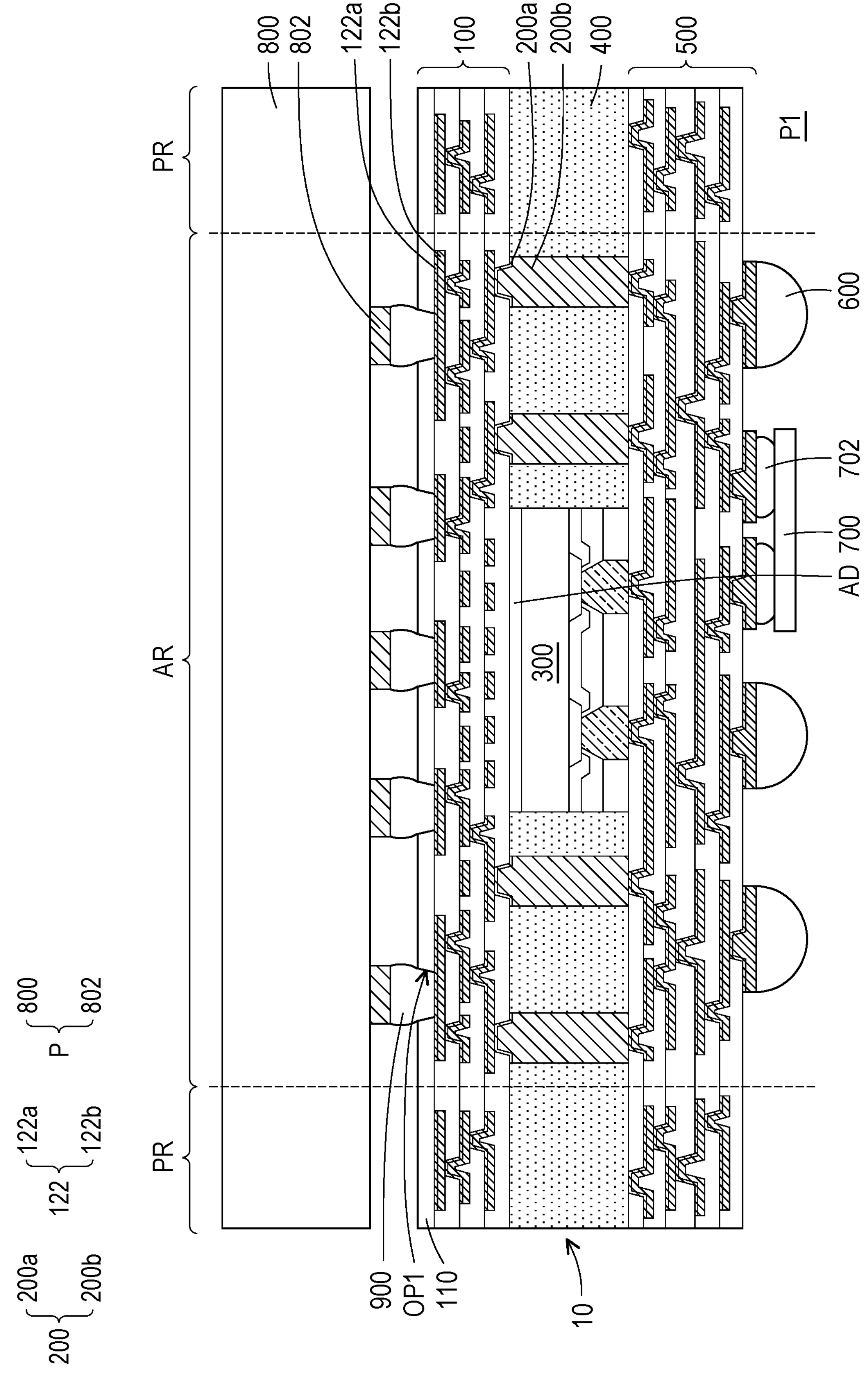

FIG. 1A to FIG. 1O are schematic cross-sectional views illustrating a manufacturing process of an integrated fan-out package 10 in accordance with some embodiments of the disclosure. Referring to FIG. 1A, a carrier C is provided. In some embodiments, the carrier C has an active region AR and a peripheral region PR surrounding the active region AR. In some embodiments, the active region AR and the peripheral region PR of the carrier C correspond to the active region AR and the peripheral region PR of the subsequently formed integrated fan-out package 10 (shown in FIG. 1O). In some embodiments, the carrier C is made of silicon, polymer, polymer composite, metal foil, ceramic, glass, glass epoxy, tape, or other suitable material for structural support. Thereafter, a dielectric layer 110 is formed on the carrier C. As illustrated in FIG. 1A, the dielectric layer 110 is conformally formed on the carrier C. For example, the dielectric layer 110 extends in both the active region AR and the peripheral region PR. In some embodiments, an adhesive layer (not shown) is formed between the carrier C and the dielectric layer 110. The adhesive layer may be detached from the carrier C by, e.g., shining an ultra-violet (UV) light on the carrier C in a subsequent carrier de-bonding process. For example, the adhesive layer is a light-to-heat-conversion (LTHC) coating layer or the like.

In some embodiments, a material of the dielectric layer 110 includes polyimide, epoxy resin, acrylic resin, phenol resin, benzocyclobutene (BCB), polybenzoxazole (PBO), or any other suitable polymer-based dielectric material. Alternatively, the dielectric layer 110 may be formed of oxides or nitrides, such as silicon oxide, silicon nitride, aluminum oxide, hafnium oxide, hafnium zirconium oxide, or the like. In some embodiments, the dielectric layer 110 includes resin mixed with filler. The dielectric layer 110 may be formed by suitable fabrication techniques, such as spin-on coating, chemical vapor deposition (CVD), plasma-enhanced chemical vapor deposition (PECVD), or the like.

Referring to FIG. 1B, a first conductive layer 120 is formed on the dielectric layer 110. In some embodiments, the first conductive layer 120 is formed by the following steps. First, a seed material layer (not shown) is conformally formed on the dielectric layer 110. In some embodiments, the seed material layer is formed through a sputtering process, a physical vapor deposition (PVD) process, or the like. In some embodiments, the seed material layer is constituted by two sub-layers. The first sub-layer may include nickel, titanium, titanium nitride, tantalum, tantalum nitride, other suitable materials, or a combination thereof. On the other hand, the second sub-layer may include copper, copper alloys, or other suitable choice of materials. After the seed material layer is conformally formed on the dielectric layer 110, a patterned photoresist layer (not shown) is formed over the seed material layer. In some embodiments, the patterned photoresist layer is made of a photosensitive material. In some embodiments, the patterned photoresist layer has a plurality of openings that correspond to locations of the first conductive layer 120 to be formed. Subsequently, the openings of the patterned photoresist layer are filled with a conductive material. In some embodiments, the conductive material includes copper, copper alloys, or the like. The conductive material is formed by electroplating, deposition, or the like. After the openings are filled with the conductive material, the patterned photoresist layer and the seed material layer underneath the patterned photoresist layer are removed though an ashing or a stripping process, so as to form the first conductive layer 120 on the dielectric layer 110.

In some embodiments, the first conductive layer 120 includes a plurality of conductive patterns 122 and a plurality of seal ring patterns 124. In some embodiments, each of the conductive patterns 122 includes a seed layer 122*a* and a conductive layer 122*b* disposed on the seed layer 122*a*. Similarly, each of the seal ring patterns 124 includes a seed layer 124*a* and a conductive layer 124*b* disposed on the seed layer 124*a*. For example, the remaining seed material layer described above constitutes the seed layer 122*a* and the seed layer 124*a* while the conductive material described above constitutes the conductive layer 122*b* and the conductive layer 124*b*. As illustrated in FIG. 1B, the conductive patterns 122 and the seal ring patterns 124 are located on a top surface of the dielectric layer 110. For example, the conductive patterns 122 and the seal ring patterns 124 are separated from the carrier C by the dielectric layer 110. In some embodiments, the conductive patterns 122 are referred to as under-ball metallurgy (UBM) patterns. In some embodiments, the seal ring patterns 124 are electrically floating. That is, the seal ring patterns 124 are not electrically connected to other conductive elements in the subsequently formed integrated fan-out package 10 and do not contribute to signal transmission during the operation of the subsequently formed integrated fan-out package 10.

As illustrated in FIG. 1B, the conductive patterns 122 are located in the active region AR while the seal ring patterns 124 are located in the peripheral region PR. In other words, the conductive patterns 122 are spatially separated from the seal ring patterns 124. For example, the conductive patterns 122 are electrically isolated from the seal ring patterns 124. In some embodiments, the conductive patterns 122 and the seal ring patterns 124 are located at a same level height. For example, the conductive patterns 122 and the seal ring patterns 124 are simultaneously formed.

Referring to FIG. 1C, a dielectric layer 130 is conformally formed on the dielectric layer 110 and the first conductive layer 120. For example, the dielectric layer 130 extends in both the active region AR and the peripheral region PR to cover the dielectric layer 110, the conductive patterns 122, and the seal ring patterns 124. In some embodiments, a material of the dielectric layer 130 is the same as the material of the dielectric layer 110. However, the disclosure is not limited thereto. In some alternative embodiments, the material of the dielectric layer 130 is different from the material of the dielectric layer 110. In some embodiments, the material of the dielectric layer 130 includes polyimide, epoxy resin, acrylic resin, phenol resin, BCB, PBO, or any other suitable polymer-based dielectric material. Alternatively, the dielectric layer 130 may be formed of oxides or nitrides, such as silicon oxide, silicon nitride, aluminum oxide, hafnium oxide, hafnium zirconium oxide, or the like. In some embodiments, the dielectric layer 130 includes resin mixed with filler. The dielectric layer 130 may be formed by suitable fabrication techniques, such as spin-on coating, CVD, PECVD, or the like.

Referring to FIG. 1D, a second conductive layer 140 is formed on the dielectric layer 130 and the first conductive layer 120. In some embodiments, the second conductive layer 140 is formed by the following steps. First, a plurality of openings (not shown) is formed in the dielectric layer 130. In some embodiments, each of the openings penetrate through the dielectric layer 130 to partially expose the underlying conductive patterns 122 and the underlying seal ring patterns 124 of the first conductive layer 120. Thereafter, a seed material layer (not shown) is conformally formed on the dielectric layer 130. For example, at least a portion of the seed material layer extends into the openings of the dielectric layer 130 to be in physical contact with the conductive patterns 122 and the seal ring patterns 124 of the first conductive layer 120. In some embodiments, the seed material layer is formed through a sputtering process, a PVD process, or the like. In some embodiments, the seed material layer is constituted by two sub-layers. The first sub-layer may include titanium, titanium nitride, tantalum, tantalum nitride, other suitable materials, or a combination thereof. On the other hand, the second sub-layer may include copper, copper alloys, or other suitable choice of materials. After the seed material layer is conformally formed on the dielectric layer 130, a patterned photoresist layer (not shown) is formed over the seed material layer. In some embodiments, the patterned photoresist layer is made of a photosensitive material. In some embodiments, the patterned photoresist layer has a plurality of openings that correspond to locations of the second conductive layer 140 to be formed. Subsequently, the openings of the patterned photoresist layer are filled with a conductive material. In some embodiments, the conductive material includes copper, copper alloys, or the like. The conductive material is formed by electroplating, deposition, or the like. After the openings are filled with the conductive material, the patterned photoresist layer and the seed material layer underneath the patterned photoresist layer are removed though an ashing or a stripping process, so as to form the second conductive layer 140 on the first conductive layer 120 and the dielectric layer 130.

In some embodiments, the second conductive layer 140 includes a plurality of conductive patterns 142 and a plurality of seal ring patterns 144. In some embodiments, each of the conductive patterns 142 includes a seed layer 142*a* and a conductive layer 142*b* disposed on the seed layer

142*a*. Similarly, each of the seal ring patterns 144 includes a seed layer 144*a* and a conductive layer 144*b* disposed on the seed layer 144*a*. For example, the remaining seed material layer described above constitutes the seed layer 142*a* and the seed layer 144*a* while the conductive material described above constitutes the conductive layer 142*b* and the conductive layer 144*b*. In some embodiments, the material of the seed layer 142*a* of the conductive patterns 142 and the material of the seed layer 144*a* of the seal ring patterns 144 are different from the material of the seed layer 122*a* of the conductive patterns 122 and the material of the seed layer 124*a* of the seal ring patterns 124. For example, the materials of the seed layer 142*a* of the conductive patterns 142 and the seed layer 144*a* of the seal ring patterns 144 include titanium while the materials of the seed layer 122*a* of the conductive patterns 122 and the seed layer 124*a* of the seal ring patterns 124 include nickel. In certain embodiments, the seed layer 142*a* of the conductive patterns 142 and the seed layer 144*a* of the seal ring patterns 144 are titanium-copper composite layers while the seed layer 122*a* of the conductive patterns 122 and the seed layer 124*a* of the seal ring patterns 124 are nickel-copper composite layers. However, the disclosure is not limited thereto. In some alternative embodiments, the material of the seed layer 142*a* of the conductive patterns 142, the material of the seed layer 144*a* of the seal ring patterns 144, the material of the seed layer 122*a* of the conductive patterns 122, and the material of the seed layer 124*a* of the seal ring patterns 124 are the same.

In some embodiments, the conductive patterns 142 extend into the openings of the dielectric layer 130. For example, the conductive patterns 142 penetrate through the dielectric layer 130 to be in physical contact with the conductive patterns 122. That is, the seed layer 142*a* of the conductive patterns 142 is in physical contact with the conductive layer 122*b* of the conductive patterns 122 such that the conductive patterns 142 is electrically connected to the conductive patterns 122. In some embodiments, the seal ring patterns 144 extend into the openings of the dielectric layer 130. For example, the seal ring patterns 144 penetrate through the dielectric layer 130 to be in physical contact with the seal ring patterns 124. That is, the seed layer 144*a* of the seal ring patterns 144 is in physical contact with the conductive layer 124*b* of the seal ring patterns 124. In some embodiments, the seal ring patterns 144 are electrically floating. That is, the seal ring patterns 144 are not electrically connected to other conductive elements in the subsequently formed integrated fan-out package 10 and do not contribute to signal transmission during the operation of the subsequently formed integrated fan-out package 10.

As illustrated in FIG. 1D, the conductive patterns 142 are located in the active region AR while the seal ring patterns 144 are located in the peripheral region PR. In other words, the conductive patterns 142 are spatially separated from the seal ring patterns 144. For example, the conductive patterns 142 are electrically isolated from the seal ring patterns 144. In some embodiments, the conductive patterns 142 and the seal ring patterns 144 are located at a same level height. For example, the conductive patterns 142 and the seal ring patterns 144 are simultaneously formed.

Referring to FIG. 1E, a dielectric layer 150 is conformally formed on the dielectric layer 130 and the second conductive layer 140. For example, the dielectric layer 150 extends in both the active region AR and the peripheral region PR to cover the dielectric layer 130, the conductive patterns 142, and the seal ring patterns 144. In some embodiments, a material of the dielectric layer 150 is the same as the material of the dielectric layers 110 and 130. However, the disclosure is not limited thereto. In some alternative embodiments, the material of the dielectric layer 150 is different from the material of the dielectric layers 110 and 130. In some embodiments, the material of the dielectric layer 150 includes polyimide, epoxy resin, acrylic resin, phenol resin, BCB, PBO, or any other suitable polymer-based dielectric material. Alternatively, the dielectric layer 150 may be formed of oxides or nitrides, such as silicon oxide, silicon nitride, aluminum oxide, hafnium oxide, hafnium zirconium oxide, or the like. In some embodiments, the dielectric layer 150 includes resin mixed with filler. The dielectric layer 150 may be formed by suitable fabrication techniques, such as spin-on coating, CVD, PECVD, or the like.

Referring to FIG. 1F, a third conductive layer 160 is formed on the dielectric layer 150 and the second conductive layer 140. In some embodiments, the third conductive layer 160 is formed by the following steps. First, a plurality of openings (not shown) is formed in the dielectric layer 150. In some embodiments, each of the openings penetrate through the dielectric layer 150 to partially expose the underlying conductive patterns 142 and the underlying seal ring patterns 144 of the second conductive layer 140. Thereafter, a seed material layer (not shown) is conformally formed on the dielectric layer 150. For example, at least a portion of the seed material layer extends into the openings of the dielectric layer 150 to be in physical contact with the conductive patterns 142 and the seal ring patterns 144 of the second conductive layer 140. In some embodiments, the seed material layer is formed through a sputtering process, a PVD process, or the like. In some embodiments, the seed material layer is constituted by two sub-layers. The first sub-layer may include titanium, titanium nitride, tantalum, tantalum nitride, other suitable materials, or a combination thereof. On the other hand, the second sub-layer may include copper, copper alloys, or other suitable choice of materials. After the seed material layer is conformally formed on the dielectric layer 150, a patterned photoresist layer (not shown) is formed over the seed material layer. In some embodiments, the patterned photoresist layer is made of a photosensitive material. In some embodiments, the patterned photoresist layer has a plurality of openings that correspond to locations of the third conductive layer 160 to be formed. Subsequently, the openings of the patterned photoresist layer are filled with a conductive material. In some embodiments, the conductive material includes copper, copper alloys, or the like. The conductive material is formed by electroplating, deposition, or the like. After the openings are filled with the conductive material, the patterned photoresist layer and the seed material layer underneath the patterned photoresist layer are removed though an ashing or a stripping process, so as to form the third conductive layer 160 on the second conductive layer 140 and the dielectric layer 150.

In some embodiments, the third conductive layer 160 includes a plurality of conductive patterns 162 and a plurality of seal ring patterns 164. In some embodiments, each of the conductive patterns 162 includes a seed layer 162*a* and a conductive layer 162*b* disposed on the seed layer 162*a*. Similarly, each of the seal ring patterns 164 includes a seed layer 164*a* and a conductive layer 164*b* disposed on the seed layer 164*a*. For example, the remaining seed material layer described above constitutes the seed layer 162*a* and the seed layer 164*a* while the conductive material described above constitutes the conductive layer 162*b* and the conductive layer 164*b*. In some embodiments, the material of the seed layer 162*a* of the conductive patterns 162 and the material of the seed layer 164*a* of the seal ring patterns 164 are different from the material of the seed layer 122*a* of the conductive patterns 122 and the material of the seed layer 124*a* of the seal ring patterns 124. For example, the materials of the seed layer 162*a* of the conductive patterns 162 and the seed layer 164*a* of the seal ring patterns 164 include titanium while the materials of the seed layer 122*a* of the conductive patterns 122 and the seed layer 124*a* of the seal ring patterns 124 include nickel. In certain embodiments, the seed layer 162*a* of the conductive patterns 162 and the seed layer 164*a* of the seal ring patterns 164 are titanium-copper composite layers while the seed layer 122*a* of the conductive patterns 122 and the seed layer 124*a* of the seal ring patterns 124 are nickel-copper composite layers. However, the disclosure is not limited thereto. In some alternative embodiments, the material of the seed layer 162*a* of the conductive patterns 162, the material of the seed layer 164*a* of the seal ring patterns 164, the material of the seed layer 122*a* of the conductive patterns 122, and the material of the seed layer 124*a* of the seal ring patterns 124 are the same.

In some embodiments, the conductive patterns 162 extend into the openings of the dielectric layer 150. For example, the conductive patterns 162 penetrate through the dielectric layer 150 to be in physical contact with the conductive patterns 144. That is, the seed layer 162*a* of the conductive patterns 162 is in physical contact with the conductive layer 142*b* of the conductive patterns 142 such that the conductive patterns 162 is electrically connected to the conductive patterns 142. In some embodiments, the seal ring patterns 164 extend into the openings of the dielectric layer 150. For example, the seal ring patterns 164 penetrate through the dielectric layer 150 to be in physical contact with the seal ring patterns 144. That is, the seed layer 164*a* of the seal ring patterns 164 is in physical contact with the conductive layer 144*b* of the seal ring patterns 144. In some embodiments, the seal ring patterns 164 are electrically floating. That is, the seal ring patterns 164 are not electrically connected to other conductive elements in the subsequently formed integrated fan-out package 10 and do not contribute to signal transmission during the operation of the subsequently formed integrated fan-out package 10.

As illustrated in FIG. 1F, the conductive patterns 162 are located in the active region AR while the seal ring patterns 164 are located in the peripheral region PR. In other words, the conductive patterns 162 are spatially separated from the seal ring patterns 164. For example, the conductive patterns 162 are electrically isolated from the seal ring patterns 164. In some embodiments, the conductive patterns 162 and the seal ring patterns 164 are located at a same level height. For example, the conductive patterns 162 and the seal ring patterns 164 are simultaneously formed.

Referring to FIG. 1G, a dielectric layer 170 is conformally formed on the dielectric layer 150 and the third conductive layer 160. For example, the dielectric layer 170 extends in both the active region AR and the peripheral region PR to cover the dielectric layer 150, the conductive patterns 162, and the seal ring patterns 164. In some embodiments, a material of the dielectric layer 170 is the same as the material of the dielectric layers 110, 130, and 150. However, the disclosure is not limited thereto. In some alternative embodiments, the material of the dielectric layer 170 is different from the material of the dielectric layers 110, 130, and 150. In some embodiments, the material of the dielectric layer 170 includes polyimide, epoxy resin, acrylic resin, phenol resin, BCB, PBO, or any other suitable polymer-based dielectric material. Alternatively, the dielectric layer 170 may be formed of oxides or nitrides, such as silicon oxide, silicon nitride, aluminum oxide, hafnium oxide, hafnium zirconium oxide, or the like. In some embodiments, the dielectric layer 170 includes resin mixed with filler. The dielectric layer 170 may be formed by suitable fabrication techniques, such as spin-on coating, CVD, PECVD, or the like.

In some embodiments, the dielectric layer 110, the first conductive layer 120, the dielectric layer 130, the second conductive layer 140, the dielectric layer 150, the third conductive layer 160, and the dielectric layer 170 are collectively referred to as a redistribution structure 100. That is, the redistribution structure 100 is formed on the carrier C. As illustrated in FIG. 1G, the dielectric layer 110, the first conductive layer 120 (i.e. the conductive patterns 122 and the seal ring patterns 124), the dielectric layer 130, the second conductive layer 140 (i.e. the conductive patterns 142 and the seal ring patterns 144), the dielectric layer 150, the third conductive layer 160 (i.e. the conductive patterns 162 and the seal ring patterns 163), and the dielectric layer 170 are stacked alternately in sequential order.

Referring to FIG. 1H, a plurality of conductive structures 200 is formed on the redistribution structure 100. In some embodiments, the conductive structures 200 are located in the active region AR. In some embodiments, the conductive structures 200 are formed by the following steps. First, a plurality of openings (not shown) is formed in the dielectric layer 170. In some embodiments, each of the openings penetrate through the dielectric layer 170 to partially expose the underlying conductive patterns 162. Meanwhile, the seal ring patterns 164 remain fully covered by the dielectric layer 170. Thereafter, a seed material layer (not shown) is conformally formed on the dielectric layer 170. For example, at least a portion of the seed material layer extends into the openings of the dielectric layer 170 to be in physical contact with the conductive patterns 162 of the third conductive layer 160. In some embodiments, the seed material layer is formed through a sputtering process, a PVD process, or the like. In some embodiments, the seed material layer is constituted by two sub-layers. The first sub-layer may include titanium, titanium nitride, tantalum, tantalum nitride, other suitable materials, or a combination thereof. On the other hand, the second sub-layer may include copper, copper alloys, or other suitable choice of materials. After the seed material layer is conformally formed on the dielectric layer 170, a patterned photoresist layer (not shown) is formed over the seed material layer. In some embodiments, the patterned photoresist layer is made of a photosensitive material. In some embodiments, the patterned photoresist layer has a plurality of openings that correspond to locations of the conductive structures 200 to be formed. Subsequently, the openings of the patterned photoresist layer are filled with a conductive material. In some embodiments, the conductive material includes copper, copper alloys, or the like. The conductive material is formed by electroplating, deposition, or the like. After the openings are filled with the conductive material, the patterned photoresist layer and the seed material layer underneath the patterned photoresist layer are removed though an ashing or a stripping process, so as to form the conductive structures 200. It should be noted that the steps described above are merely exemplary steps for forming the conductive structures 200, and the disclosure is not limited thereto. In some alternative embodiments, the conductive structures 200 may be formed by pick and place pre-fabricated conductive posts onto the redistribution structure 100.

In some embodiments, each of the conductive structures 200 includes a seed layer 200*a* and a conductive layer 200*b* disposed on the seed layer 200*a*. For example, the remaining seed material layer described above constitutes the seed layer 200*a* while the conductive material described above constitutes the conductive layer 200*b*. In some embodiments, the conductive structures 200 extend into the openings of the dielectric layer 170. For example, a portion of each of the conductive structures 200 penetrates through the dielectric layer 170 to be in physical contact with the conductive patterns 162. That is, the seed layer 200*a* of the conductive structures 200 is in physical contact with the conductive layer 162*b* of the conductive patterns 162 such that the conductive structures 200 are electrically connected to the third conductive layer 160. In other words, the conductive structures 200 are electrically connected to the redistribution structure 100.

Referring to FIG. 1I, a die 300 is formed on the redistribution structure 100. In some embodiments, the die 300 is located in the active region AR. In some embodiments, the die 300 is attached to the redistribution structure 100 through an adhesive layer AD. In some embodiments, the adhesive layer AD includes a die attach film (DAF) or the like. In some embodiments, the die 300 is placed over the redistribution structure 100 through a pick-and-place process. In some embodiments, the adhesive layer AD is attached to the die 300 prior to the placement of the die 300 onto the redistribution structure 100. In some embodiments, the die 300 includes a semiconductor substate 310, a plurality of conductive pads 320, a passivation layer 330, a post-passivation layer 340, a plurality of metallic posts 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post-passivation layer 340. The post-passivation layer 340 may be a polyimide layer, a PBO layer, or a dielectric layer formed by other suitable polymers. In addition, the metallic posts 350 are formed on the conductive pads 320. In some embodiments, the metallic posts 350 are plated on the conductive pads 320. The protection layer 360 is formed on the post-passivation layer 340 to cover the metallic posts 350.

As illustrated in FIG. 1I, the die 300 has a rear surface 300*a* and a front surface 300*b* opposite to the rear surface 300*a*. In some embodiments, the rear surface 300*a* of the die 300 is adhered to the dielectric layer 170 through the adhesive layer AD. On the other hand, the front surface 300*b* of the die 300 faces upward and is exposed. In some embodiments, the die 300 is formed to be surrounded by the conductive structures 200.

As illustrated in FIG. 1H and FIG. 1I, the formation of the conductive structures 200 is taken place prior to the placement of the die 300. However, the disclosure is not limited thereto. In some alternative embodiments, the die 300 may be placed onto the redistribution structure 100 prior to the formation of the conductive structures 200.

Referring to FIG. 1J, an encapsulation material 400' is formed on the redistribution structure 100 to encapsulate the conductive structures 200, the die 300, and the adhesive layer AD. In some embodiments, the conductive structures 200 and the protection layer 360 of the die 300 are encapsulated by the encapsulation material 400'. In other words, the conductive structures 200 and the protection layer 360 of the die 300 are not revealed and are well protected by the encapsulation material 400'. In some embodiments, the encapsulation material 400' includes a molding compound, a molding underfill, a resin (such as epoxy), or the like. The encapsulation material 400' may be formed by a molding process, such as a compression molding process.

Referring to FIG. 1J and FIG. 1K, the encapsulation material 400' and the protection layer 360 of the die 300 are grinded until top surfaces of the metallic posts 350 are exposed. After the encapsulation material 400' is grinded, an encapsulant 400 is formed on the redistribution structure 100 to laterally encapsulate the conductive structures 200, the die 300, and the adhesive layer AD. In some embodiments, the encapsulant material 400' is grinded by a mechanical grinding process and/or a chemical mechanical polishing (300*c*) process. In some embodiments, during the grinding process of the encapsulant material 400', the protection layer 360 is grinded to reveal the metallic posts 350. In some embodiments, portions of the metallic posts 350 and portions of the conductive structures 200 are slightly grinded as well. After grinding, the die 300 has an active surface 300*c* and a rear surface 300*a* opposite to the active surface 300*c*. The exposed portion of the metallic posts 350 is located on the active surface 300*c* of the die 300. In some embodiments, the encapsulant 400 encapsulates sidewalls of the conductive structures 200, sidewalls of the die 300, and sidewalls of the adhesive layer AD. For example, the encapsulant 400 is penetrated by the conductive structures 200. As shown in FIG. 1K, top surfaces $T_{200}$ of the conductive structures 200, the active surface 300*c* of the die 300, and a top surface $T_{400}$ of the encapsulant 400 are substantially coplanar.

Referring to FIG. 1L, a redistribution structure 500 is formed on the conductive structure 200, the die 300, and the encapsulant 400. For example, the redistribution structure 500 is disposed over the redistribution structure 100 such that the conductive structures 200, the die 300, and the encapsulant 400 are located between the redistribution structure 100 and the redistribution structure 500. In some embodiments, the redistribution structure 500 includes a plurality of dielectric layers 510, 530, 550, 570, 590, a fourth conductive layer 520, a fifth conductive layer 540, a sixth conductive layer 560, a seventh conductive layer 580, and a plurality of UBM patterns 595.

In some embodiments, materials and formation methods of the dielectric layers 510, 530, 550, 570, and 590 are similar to the materials and the formation methods of the dielectric layers 110, 130, 150, and 170, so the descriptions thereof are omitted herein.

In some embodiments, the fourth conductive layer 520 includes a plurality of conductive patterns 522 and a plurality of seal ring patterns 524, the fifth conductive layer 540 includes a plurality of conductive patterns 542 and a plurality of seal ring patterns 544, the sixth conductive layer 560 includes a plurality of conductive patterns 562 and a plurality of seal ring patterns 564, and the seventh conductive layer 580 includes a plurality of conductive patterns 582 and a plurality of seal ring patterns 584. In some embodiments, the conductive patterns 522 and the seal ring patterns 524 are simultaneously formed and are located at the same level height. Similarly, the conductive patterns 542 and the seal ring patterns 544 are simultaneously formed and are located at the same level height. In addition, the conductive patterns 562 and the seal ring patterns 564 are simultaneously formed and are located at the same level height. Furthermore, the conductive patterns 582 and the seal ring patterns 584 are simultaneously formed and are located at the same level height.

In some embodiments, each conductive pattern 522 includes a seed layer 522*a* and a conductive layer 522*b* disposed on the seed layer 522*a*, each conductive pattern 542 includes a seed layer 542*a* and a conductive layer 542*b* disposed on the seed layer 542*a*, each conductive pattern 562 includes a seed layer 562*a* and a conductive layer 562*b* disposed on the seed layer 562*a*, each conductive pattern 582 includes a seed layer 582*a* and a conductive layer 582*b* disposed on the seed layer 582*a*, and each UBM pattern 595 includes a seed layer 595*a* and a conductive layer 595*b* disposed on the seed layer 595*a*. Meanwhile, each seal ring patterns 524 includes a seed layer 524*a* and a conductive layer 524*b* disposed on the seed layer 524*a*, each seal ring pattern 544 includes a seed layer 544*a* and a conductive layer 544*b* disposed on the seed layer 544*a*, each seal ring pattern 564 includes a seed layer 564*a* and a conductive layer 564*b* disposed on the seed layer 564*a*, and each conductive pattern 584 includes a seed layer 584*a* and a conductive layer 584*b* disposed on the seed layer 584*a*. In some embodiments, materials and formation methods of the conductive patterns 522, 542, 562, 582, the UBM patterns 595, and the seal ring patterns 524, 544, 564, 584 are similar to the materials and the formation methods of the conductive patterns 142, 162 and the seal ring patterns 144, 164, so the detailed descriptions therefore are omitted herein.

As illustrated in FIG. 1L, the dielectric layer 510, the fourth conductive layer 520 (i.e. the conductive patterns 522 and the seal ring patterns 524), the dielectric layer 530, the fifth conductive layer 540 (i.e. the conductive patterns 542 and the seal ring patterns 544), the dielectric layer 550, the sixth conductive layer 560 (i.e. the conductive patterns 562 and the seal ring patterns 563), the dielectric layer 570, the seventh conductive layer 580 (i.e. the conductive patterns 582 and the seal ring patterns 584), the dielectric layer 590, and the UBM patterns 595 are stacked alternately in sequential order.

As illustrated in FIG. 1L, the conductive patterns 522, 542, 562, 582 and the UBM patterns 595 are located in the active region AR. In some embodiments, the conductive patterns 522 penetrate through the underlying dielectric layer 510 to be in physical contact with the conductive structure 200 and the metallic posts 350 of the die 300. Similarly, the conductive patterns 542 penetrate through the underlying dielectric layer 530 to be in physical contact with the conductive patterns 522. In addition, the conductive patterns 562 penetrate through the underlying dielectric layer 550 to be in physical contact with the conductive patterns 542. Moreover, the conductive patterns 582 penetrate through the underlying dielectric layer 570 to be in physical contact with the conductive patterns 562. Furthermore, the UBM patterns 595 penetrate through the underlying dielectric layer 590 to be in physical contact with the conductive patterns 582. In other words, the conductive patterns 522, 542, 562, 582 and the UBM patterns 595 are electrically connected to one another and are electrically connected to the conductive structures 200 and the die 300.

As illustrated in FIG. 1L, the conductive structures 200 penetrate through the encapsulant 400 to electrically connect the conductive patterns 122, 142, 162 of the redistribution structure 100 and the conductive patterns 522, 542, 562, 582 and the UBM patterns 595 of the redistribution structure 500.

As illustrated in FIG. 1L, the seal ring patterns 524, 544, 564, and 584 are located in the peripheral region PR. In some embodiments, the seal ring patterns 524 penetrate through the underlying dielectric layer 510 to be in physical contact with the encapsulant 400. Similarly, the seal ring patterns 544 penetrate through the underlying dielectric layer 530 to be in physical contact with the seal ring patterns 524. In addition, the seal ring patterns 564 penetrate through the underlying dielectric layer 550 to be in physical contact with the seal ring patterns 544. Moreover, the seal ring patterns 584 penetrate through the underlying dielectric layer 570 to be in physical contact with the seal ring patterns 564. However, the seal ring patterns 524, 544, 564, and 584 are electrically floating. That is, the seal ring patterns 524, 544, 564, and 584 are not electrically connected to other conductive elements in the subsequently formed integrated fan-out package 10 and do not contribute to signal transmission during the operation of the subsequently formed integrated fan-out package 10.

As mentioned above, the conductive patterns 522, 542, 562, 582 and the UBM patterns 595 are located in the active region AR while the seal ring patterns 524, 544, 564, and 584 are located in the peripheral region PR. In other words, the conductive patterns 522, 542, 562, 582 and the UBM patterns 595 are spatially separated from the seal ring patterns 524, 544, 564, and 584. For example, the conductive patterns 522, 542, 562, 582 and the UBM patterns 595 are electrically isolated from the seal ring patterns 524, 544, 564, and 584.

In some embodiments, the seal ring patterns 124, 144, 164, 524, 544, 564, and 584 collectively form a seal ring structure SRS. The configuration of the seal ring structure SRS will be described below in conjunction with FIG. 2.

Figure 2:
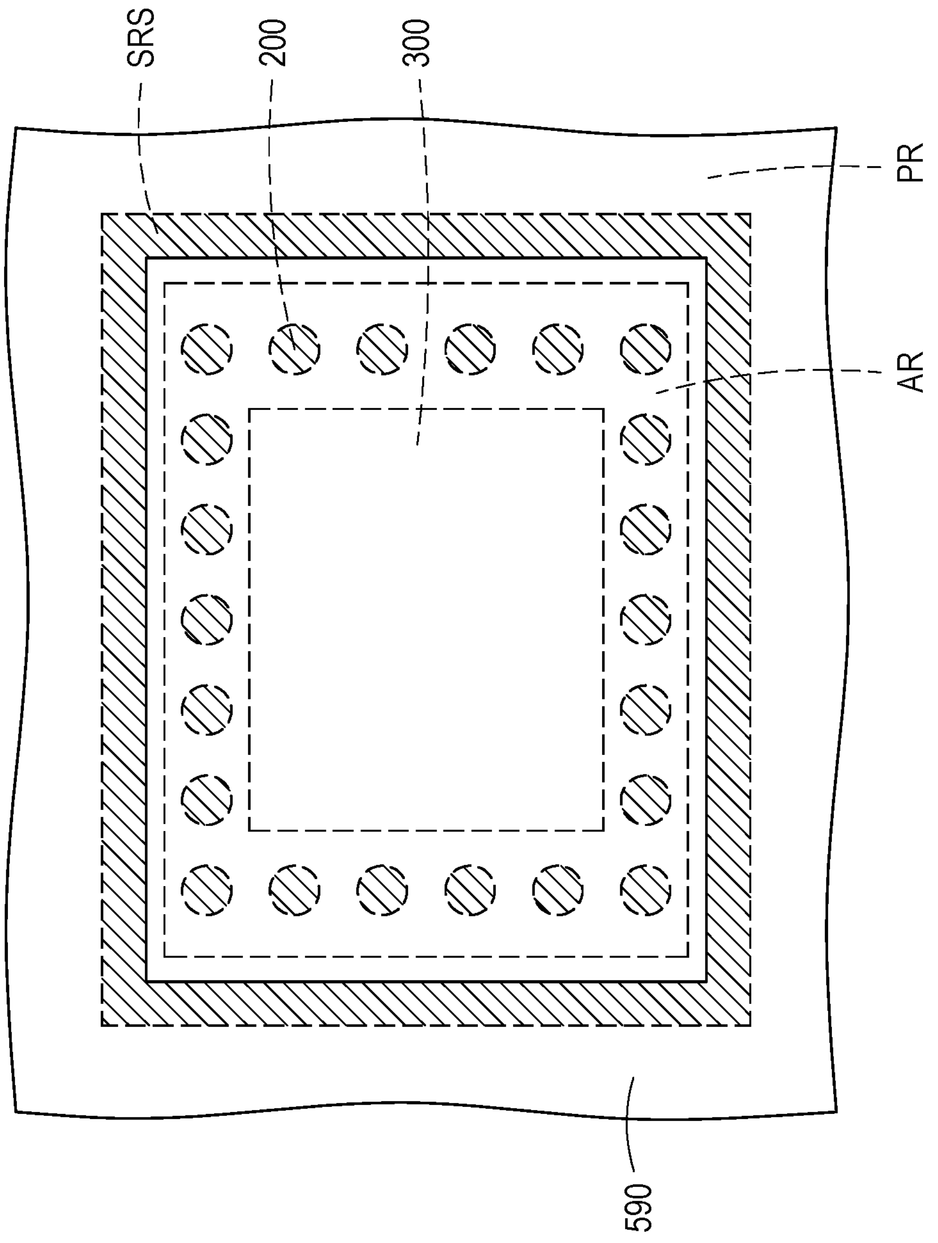
FIG. 2 is a schematic top view of FIG. 1L.

FIG. 2 is a schematic top view of FIG. 1L. For simplicity, certain elements (for example, the UBM patterns 595 and the conductive patterns 522, 542, 562, 582) are omitted in the top view of FIG. 2. Referring to FIG. 1L and FIG. 2, the seal ring structure SRS is disposed in the peripheral region PR. Moreover, the seal ring structure SRS is formed to be a continuous structure from the top view. For example, the seal ring structure SRS exhibits a rectangular ring shape to surround the conductive structures 200 and the die 300 in the top view. In some embodiments, the seal ring patterns 524, 544, 564, and 584 in the redistribution structure 500 may be referred to as a first portion of the seal ring structure SRS. Meanwhile, the seal ring patterns 124, 144, and 164 in the redistribution structure 100 may be referred to as a second portion of the seal ring structure SRS. As illustrated in FIG. 1L, the first portion of the seal ring structure SRS is embedded in the redistribution structure 500 while the second portion of the seal ring structure SRS is embedded in the redistribution structure 100. In some embodiments, the first portion of the seal ring structure SRS is spatially separated from the second portion of the seal ring structure SRS. For example, the first portion of the seal ring structure SRS is separated from the second portion of the seal ring structure SRS by the encapsulant 400 disposed therebetween. As such, the seal ring structure SRS may be considered as a discontinuous structure in a cross-sectional view, as shown in FIG. 1L.

In some embodiments, since the seal ring structure SRS is embedded in both the redistribution structure 100 and the redistribution structure 500, the mechanical strength of the redistribution structures 100 and 500 may be sufficiently enhanced. In other words, the structure rigidity of the redistribution structures 100 and 500 is sufficient to withstand the subsequent high temperature processes (such as reflow process or the like). As such, crack, delamination, and warpage issues of the redistribution structures 100 and 500 may be effectively alleviated, and the reliability of the subsequently formed integrated fan-out package 10 and the subsequently formed package-on-package (PoP) structure P1 may be ensured.

Referring to FIG. 1M, a plurality of conductive terminals 600 and a passive component 700 are formed on the redistribution structure 500. For example, the conductive terminals 600 and the passive component 700 are electrically connected to the redistribution structure 500. In some embodiments, the conductive terminals 600 include solder balls, ball grid array (BGA) balls, or the like. In some embodiments, the conductive terminals 600 are made of a conductive material with low resistivity, such as Sn, Pb, Ag, Cu, Ni, Bi, or an alloy thereof. In some embodiments, the conductive terminals 600 are attached to some of the UBM patterns 595. For example, the conductive terminals 600 may be placed on these UBM patterns 595 through a ball placement process. Thereafter, a reflow process is performed to securely fix the conductive terminals 600 on these UBM patterns 595.

In some embodiments, the passive component 700 includes capacitors, resistors, inductors, antennas, the like, or a combination thereof. In some embodiments, the passive component 700 is mounted to some of the UBM patterns 595. For example, the passive component 700 may be mounted on these UBM patterns 595 through conductive joints 702. In some embodiments, the conductive joints 702 include solder joints, BGA joints, or the like. In some embodiments, the conductive joints 702 are made of a conductive material with low resistivity, such as Sn, Pb, Ag, Cu, Ni, Bi, or an alloy thereof. After the passive component 700 is mounted to some of the UBM patterns 595, a reflow process is performed to securely fix the passive component 700 on these UBM patterns 595.

Referring to FIG. 1M and FIG. IN, the structure illustrated in FIG. 1M is flipped upside down and is placed on a dicing tape TP. Thereafter, the carrier C is removed to expose the dielectric layer 110 of the redistribution structure 100. In some embodiments, the carrier C is removed by a suitable process, such as etching, grinding, mechanical peeling-off, or the like. In an embodiment where the adhesive layer (e.g., the LTHC film) is formed on the carrier C, the carrier C is de-bonded by exposing to a laser or UV light. The laser or UV light breaks the chemical bonds of the adhesive layer that binds to the carrier C, and the carrier C may then be de-bonded. Residues of the adhesive layer, if any, may be removed by a cleaning process performed after the carrier de-bonding process.

Thereafter, the dielectric layer 110 is patterned such that a plurality of contact openings OP1 is formed to partially expose the conductive patterns 122. For example, the seed layer 122*a* of each conductive pattern 122 is partially exposed by the contact openings OP1. Meanwhile, the topmost seal ring pattern (i.e. the seal ring pattern 124) of the redistribution structure 100 is still fully covered by the topmost dielectric layer (i.e. the dielectric layer 110) of the redistribution structure 100. That is, a top surface $T_{110}$ of the topmost dielectric layer (i.e. the dielectric layer 110) of the redistribution structure 100 is located at a level height higher than that of a top surface $T_{124}$ of the topmost seal ring pattern (i.e. the seal ring pattern 124) of the redistribution structure 100. In some embodiments, the contact openings OP1 of the dielectric layer 110 are formed by a laser drilling process, a mechanical drilling process, or other suitable processes.

As mentioned above, the material of the seed layer of the topmost seal ring pattern (i.e. the seed layer 124*a* of the seal ring pattern 124) of the redistribution structure 100 may be different from the material of the seed layer of the rest of the seal ring patterns (i.e. the seed layer 144*a* of the seal ring pattern 144 and the seed layer 164*a* of the seal ring pattern 164) of the redistribution structure 100. For example, the material of the seed layer of the topmost seal ring pattern (i.e. the seed layer 124*a* of the seal ring pattern 124) of the redistribution structure 100 includes nickel. Meanwhile, the material of the seed layer of the rest of the seal ring patterns (i.e. the seed layer 144*a* of the seal ring pattern 144 and the seed layer 164*a* of the seal ring pattern 164) of the redistribution structure 100 includes titanium.

Referring to FIG. IN and FIG. 1O, a singulation process is performed on the structure illustrated in FIG. IN. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the unsingulated structure to form trenches (not shown) in the said structure. Thereafter, a mechanical cutting process may be performed on the locations of the trenches to cut through the said structure, so as to obtain a plurality of integrated fan-out packages 10 shown in FIG. 1O.

After the integrated fan-out packages 10 are obtained, the dicing tape TP is removed. Thereafter, a package P is stacked on the integrated fan-out package 10 to obtain a package-on-package (PoP) structure P1. In some embodiments, the package P includes a package body 800 and a plurality of conductive pads 802 attached to the package body 800. In some embodiments, the package body 800 of the package P includes, for example, at least a memory device. However, the disclosure is not limited thereto. Other packages may be adopted as the package P based on the functional demand of the PoP structure P1. The conductive pads 802 are disposed on a surface of the package body 800 for external connection.

As illustrated in FIG. 1O, the package P is attached to the integrated fan-out package 10 through a plurality of connectors 900. For example, the connectors 900 are in physical contact with both the conductive pads 802 and the conducive patterns 122 to render electrical connection between the package P and the redistribution structure 100 of the integrated fan-out package 10. In some embodiments, the connectors 900 include solder balls, BGA balls, or the like. In some embodiments, the connectors 900 are made of a conductive material with low resistivity, such as Sn, Pb, Ag, Cu, Ni, Bi, or an alloy thereof. In some embodiments, the connectors 900 extend into the contact openings OP1 of the dielectric layer 110 to be in physical contact with the seed layer 122*a* of the conductive patterns 122. That is, the connectors 900 are partially embedded in the redistribution structure 100. In some embodiments, the connectors 900 is attached to the conductive pads 802 of the package P and the conductive patterns 122 of the integrated fan-out package 10 through a ball placement process. Thereafter, a reflow process is performed to securely fix the connectors 900 on the conductive pads 802 and the conductive patterns 122. As illustrated in FIG. 1O, the connectors 900 are located in the active region AR. In some embodiments, an underfill layer (not shown) may be optionally formed between the integrated fan-out package 10 and the package P to encapsulate the connectors 900.

Figure 3A:
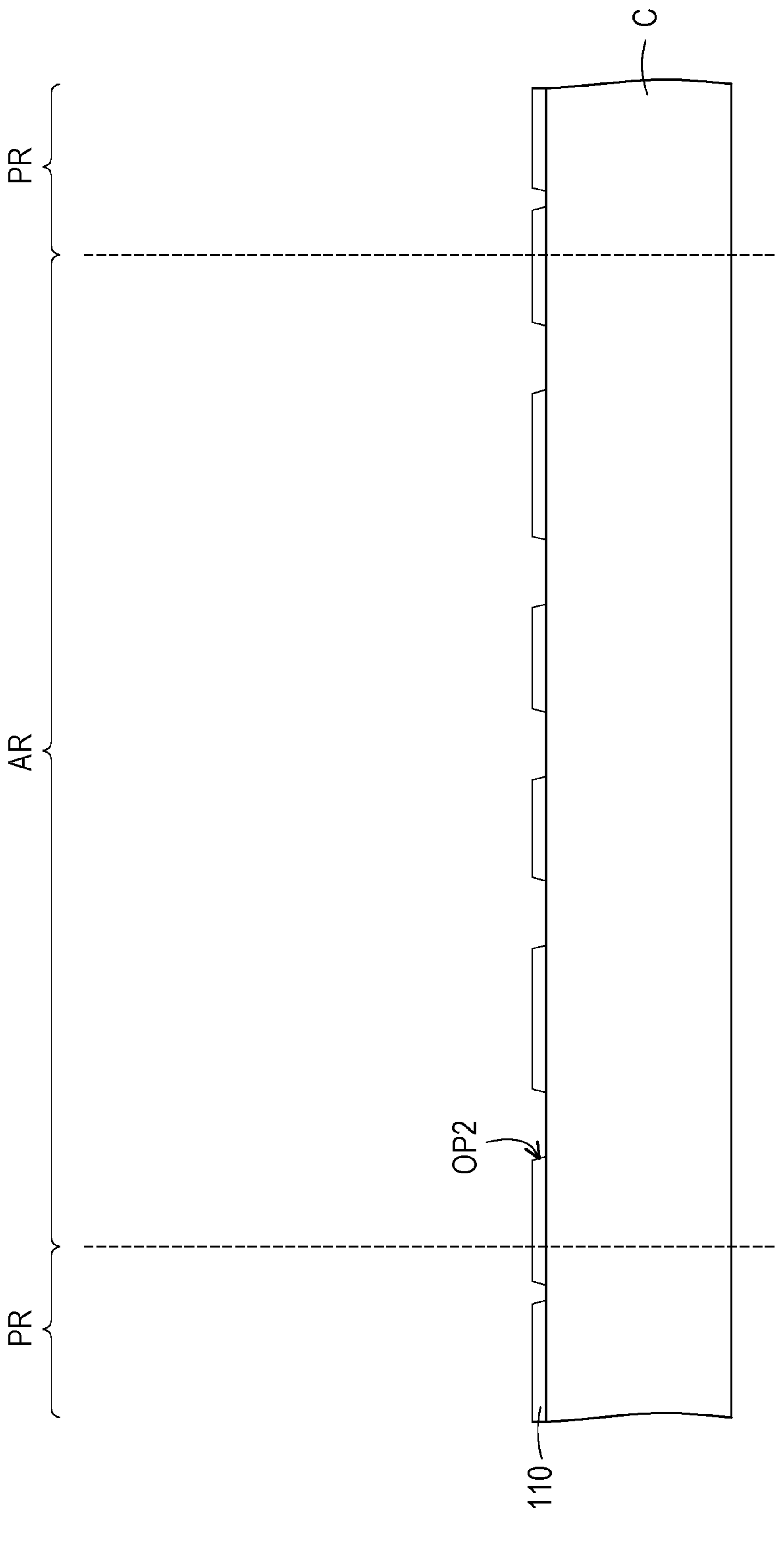
FIG. 3A to FIG. 3D are schematic cross-sectional views illustrating a manufacturing process of a PoP structure in accordance with some alternative embodiments of the disclosure.

FIG. 3A to FIG. 3D are schematic cross-sectional views illustrating a manufacturing process of a PoP structure P2 in accordance with some alternative embodiments of the disclosure. Referring to FIG. 3A, a carrier C is provided. In some embodiments, the carrier C has an active region AR and a peripheral region PR surrounding the active region AR. In some embodiments, the active region AR and the peripheral region PR of the carrier C correspond to the active region AR and the peripheral region PR of the subsequently formed integrated fan-out package 20 (shown in FIG. 3D). In some embodiments, the carrier C is made of silicon, polymer, polymer composite, metal foil, ceramic, glass, glass epoxy, tape, or other suitable material for structural support. Thereafter, a dielectric layer 110 is formed on the carrier C. As illustrated in FIG. 3A, the dielectric layer 110 is conformally formed on the carrier C. For example, the dielectric layer 110 extends in both the active region AR and the peripheral region PR. In some embodiments, an adhesive layer (not shown) is formed between the carrier C and the dielectric layer 110. The adhesive layer may be detached from the carrier C by, e.g., shining an ultra-violet (UV) light on the carrier C in a subsequent carrier de-bonding process. For example, the adhesive layer is a light-to-heat-conversion (LTHC) coating layer or the like. As illustrated in FIG. 3A, a plurality of openings OP2 is formed in the dielectric layer 110. In some embodiments, each of the openings OP2 penetrate through the dielectric layer 110 to expose the underlying carrier C or the underlying adhesive layer (if present).

In some embodiments, a material of the dielectric layer 110 includes polyimide, epoxy resin, acrylic resin, phenol resin, BCB, PBO, or any other suitable polymer-based dielectric material. Alternatively, the dielectric layer 110 may be formed of oxides or nitrides, such as silicon oxide, silicon nitride, aluminum oxide, hafnium oxide, hafnium zirconium oxide, or the like. In some embodiments, the dielectric layer 110 includes resin mixed with filler. The dielectric layer 110 may be formed by suitable fabrication techniques, such as spin-on coating, CVD, PECVD, or the like.

Figure 3B:
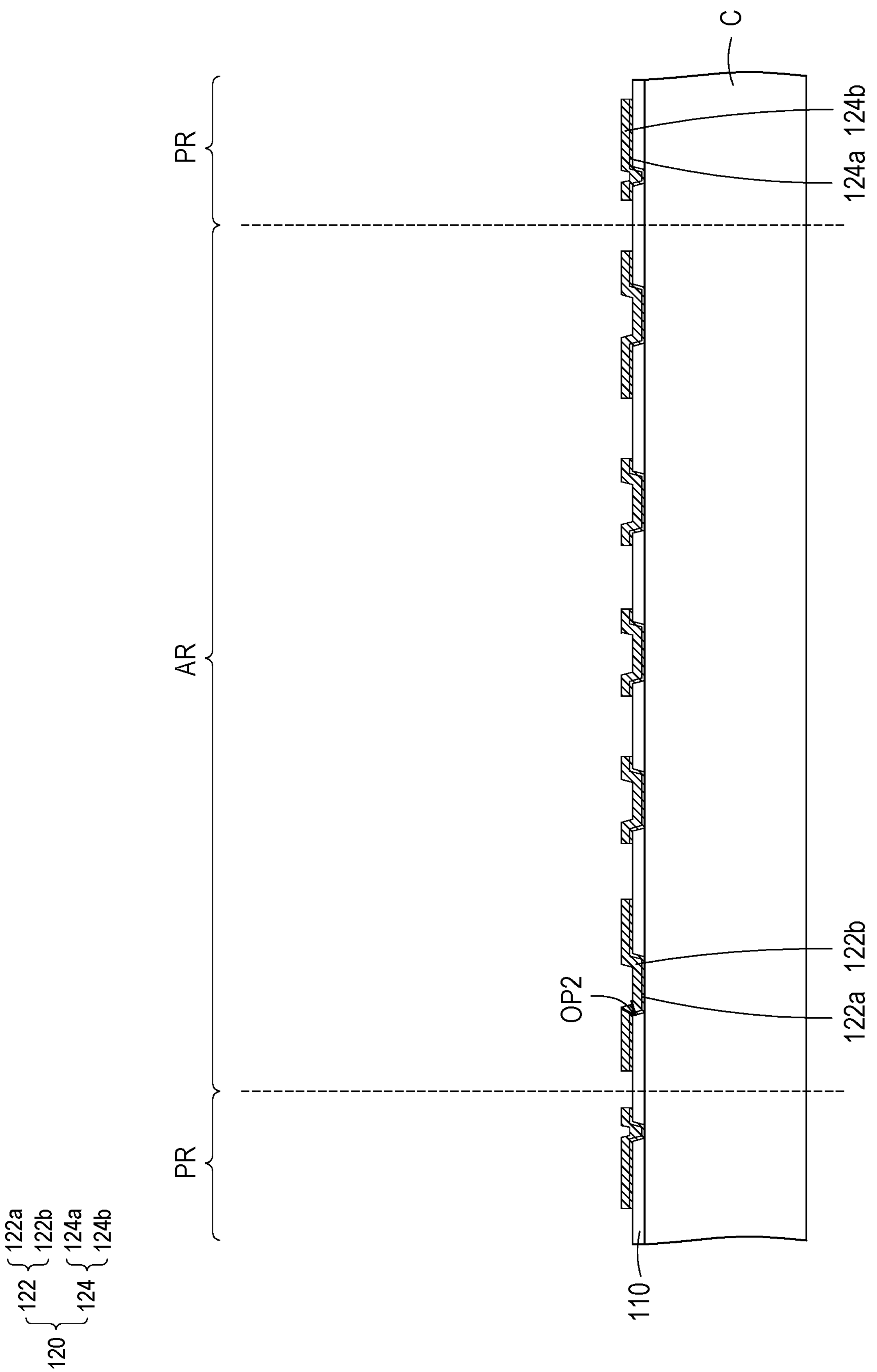

Referring to FIG. 3B, a first conductive layer 120 is formed on the dielectric layer 110. In some embodiments, the first conductive layer 120 is formed by the following steps. First, a seed material layer (not shown) is conformally formed on the dielectric layer 110. For example, at least a portion of the seed material layer extends into the openings OP2 of the dielectric layer 110 to be in physical contact with the carrier C or the adhesive layer (if present). In some embodiments, the seed material layer is formed through a sputtering process, a PVD process, or the like. In some embodiments, the seed material layer is constituted by two sub-layers. The first sub-layer may include nickel, titanium, titanium nitride, tantalum, tantalum nitride, other suitable materials, or a combination thereof. On the other hand, the second sub-layer may include copper, copper alloys, or other suitable choice of materials. After the seed material layer is conformally formed on the dielectric layer 110, a patterned photoresist layer (not shown) is formed over the seed material layer. In some embodiments, the patterned photoresist layer is made of a photosensitive material. In some embodiments, the patterned photoresist layer has a plurality of openings that correspond to locations of the first conductive layer 120 to be formed. Subsequently, the openings of the patterned photoresist layer are filled with a conductive material. In some embodiments, the conductive material includes copper, copper alloys, or the like. The conductive material is formed by electroplating, deposition, or the like. After the openings are filled with the conductive material, the patterned photoresist layer and the seed material layer underneath the patterned photoresist layer are removed though an ashing or a stripping process, so as to form the first conductive layer 120 on the dielectric layer 110.

In some embodiments, the first conductive layer 120 includes a plurality of conductive patterns 122 and a plurality of seal ring patterns 124. In some embodiments, each of the conductive patterns 122 includes a seed layer **122*a* and a conductive layer 122*b* disposed on the seed layer 122*a*. Similarly, each of the seal ring patterns 124 includes a seed layer 124*a* and a conductive layer 124*b* disposed on the seed layer 124*a*. For example, the remaining seed material layer described above constitutes the seed layer 122*a* and the seed layer 124*a* while the conductive material described above constitutes the conductive layer 122*b* and the conductive layer 124*b*. In some embodiments, the conductive patterns 122 extend into the openings OP2 of the dielectric layer 110. For example, the conductive patterns 122 penetrate through the dielectric layer 110 to be in physical contact with the underlying carrier C or the underlying adhesive layer (if present). That is, the seed layer 122*a* of the conductive patterns 122 is in physical contact with the underlying carrier C or the underlying adhesive layer (if present). In some embodiments, the conductive patterns 122 are referred to as UBM patterns. In some embodiments, the seal ring patterns 124 extend into the openings OP2 of the dielectric layer 110. For example, the seal ring patterns 124 penetrate through the dielectric layer 110 to be in physical contact with the underlying carrier C or the underlying adhesive layer (if present). That is, the seed layer 124*a* of the seal ring patterns 124 is in physical contact with the underlying carrier C or the underlying adhesive layer (if present). In some embodiments, the seal ring patterns 124 are electrically floating. That is, the seal ring patterns 124 are not electrically connected to other conductive elements in the subsequently formed integrated fan-out package 20 and do not contribute to signal transmission during the operation of the subsequently formed integrated fan-out package 20**.

Figure 3C:
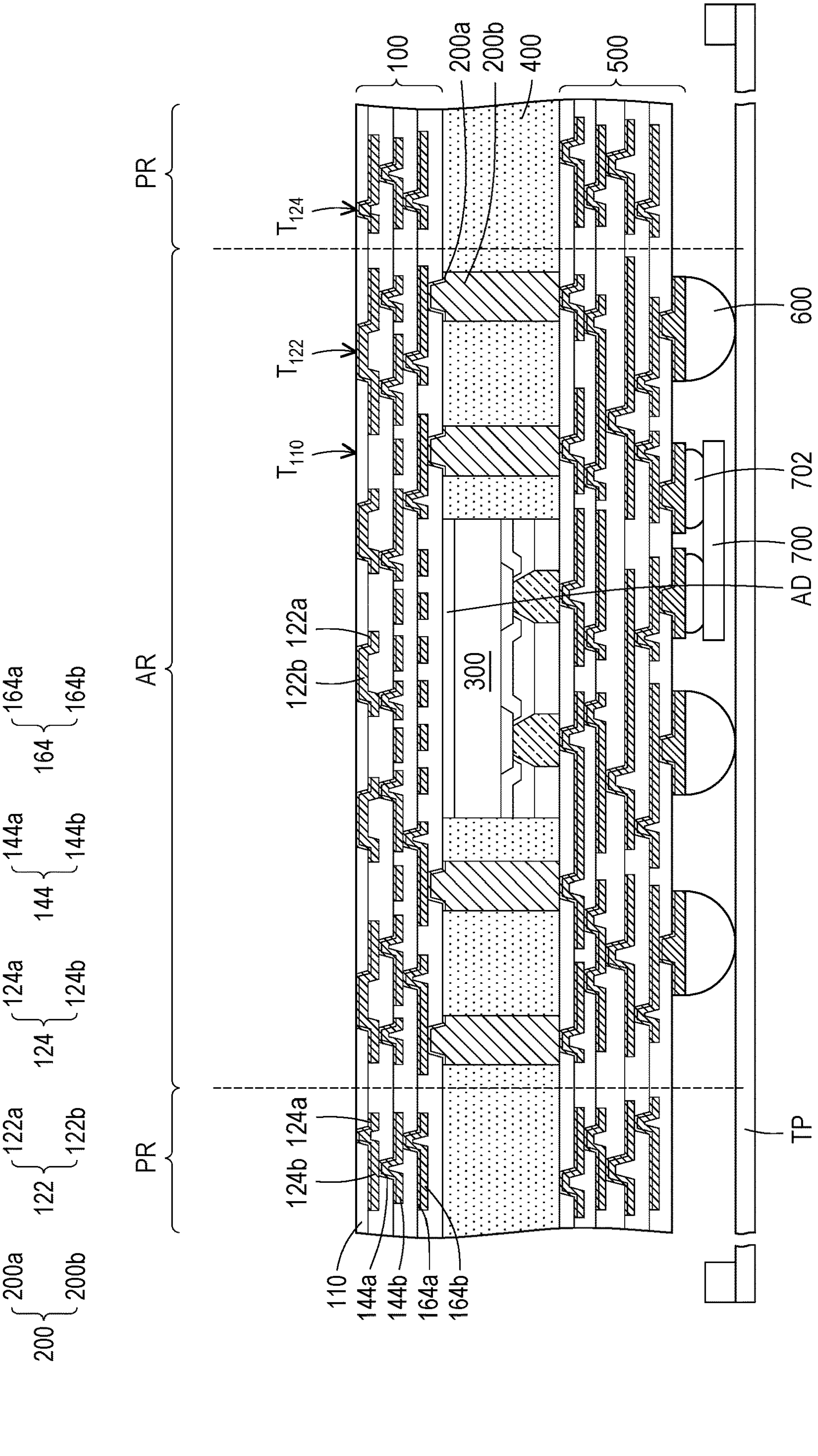

Thereafter, the steps illustrated in FIG. 1C to FIG. IN are performed to obtain the structure shown in FIG. 3C. Referring to FIG. 1N and FIG. 3C, similar elements are denoted by the same reference numeral and the detailed descriptions thereof are omitted herein.

Referring to FIG. 3C, the topmost conductive pattern (i.e. the conductive pattern 122) and the topmost seal ring pattern (i.e. the seal ring pattern 124) of the redistribution structure 100 are exposed. As illustrated in FIG. 3C, a top surface $T_{110}$ of the topmost dielectric layer (i.e. the dielectric layer 110) of the redistribution structure 100, a top surface $T_{122}$ of the topmost conductive pattern (i.e. the conductive pattern 122) of the redistribution structure 100, and a top surface $T_{124}$ of the topmost seal ring pattern (i.e. the seal ring pattern 124) of the redistribution structure 100 are substantially coplanar.

As mentioned above, the material of the seed layer of the topmost seal ring pattern (i.e. the seed layer **124*a* of the seal ring pattern 124) of the redistribution structure 100 may be different from the material of the seed layer of the rest of the seal ring patterns (i.e. the seed layer 144*a* of the seal ring pattern 144 and the seed layer 164*a* of the seal ring pattern 164) of the redistribution structure 100. For example, the material of the seed layer of the topmost seal ring pattern (i.e. the seed layer 124***a* of the seal ring pattern 124) of the redistribution structure 100 includes nickel. Meanwhile, the material of the seed layer of the rest of the seal ring patterns (i.e. the seed layer 144*a* of the seal ring pattern 144 and the seed layer 164*a* of the seal ring pattern 164) of the redistribution structure 100 includes titanium.

Figure 3D:
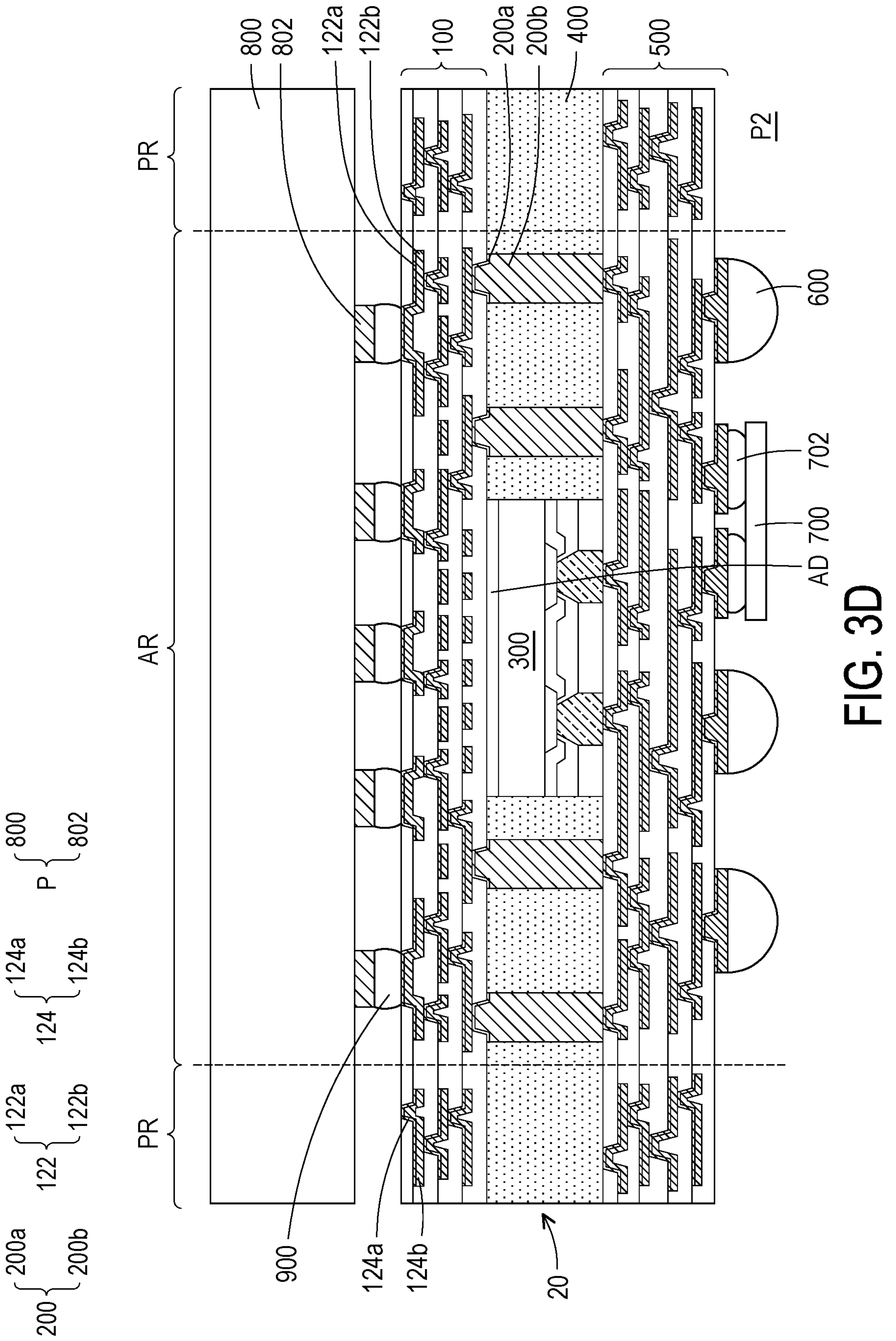

Referring to FIG. 3C and FIG. 3D, a singulation process is performed on the structure illustrated in FIG. 3C. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the unsingulated structure to form trenches (not shown) in the said structure. Thereafter, a mechanical cutting process may be performed on the locations of the trenches to cut through the said structure, so as to obtain a plurality of integrated fan-out packages 20 shown in FIG. 3D.

In some embodiments, since the seal ring structure SRS is embedded in both the redistribution structure 100 and the redistribution structure 500, the mechanical strength of the redistribution structures 100 and 500 may be sufficiently enhanced. In other words, the structure rigidity of the redistribution structures 100 and 500 is sufficient to withstand the subsequent high temperature processes (such as reflow process or the like). As such, crack, delamination, and warpage issues of the redistribution structures 100 and 500 may be effectively alleviated, and the reliability of the integrated fan-out package 20 and the subsequently formed PoP structure P2 may be ensured.

After the integrated fan-out packages 20 are obtained, the dicing tape TP is removed. Thereafter, a package P is stacked on the integrated fan-out package 20 to obtain a POP structure P2. In some embodiments, the package P in FIG. 3D is similar to the package P in FIG. 1O, so the detailed description thereof is omitted herein. As illustrated in FIG. 3D, the package P is attached to the integrated fan-out package 20 through a plurality of connectors 900. For example, the connectors 900 are in physical contact with both the conductive pads 802 and the conducive patterns 122 to render electrical connection between the package P and the redistribution structure 100 of the integrated fan-out package 20. In some embodiments, the connectors 900 in FIG. 3D are similar to the connectors 900 in FIG. 1O, so the detailed descriptions thereof are omitted herein. In some embodiments, an underfill layer (not shown) may be optionally formed between the integrated fan-out package 20 and the package P to encapsulate the connectors 900.

Figure 4:
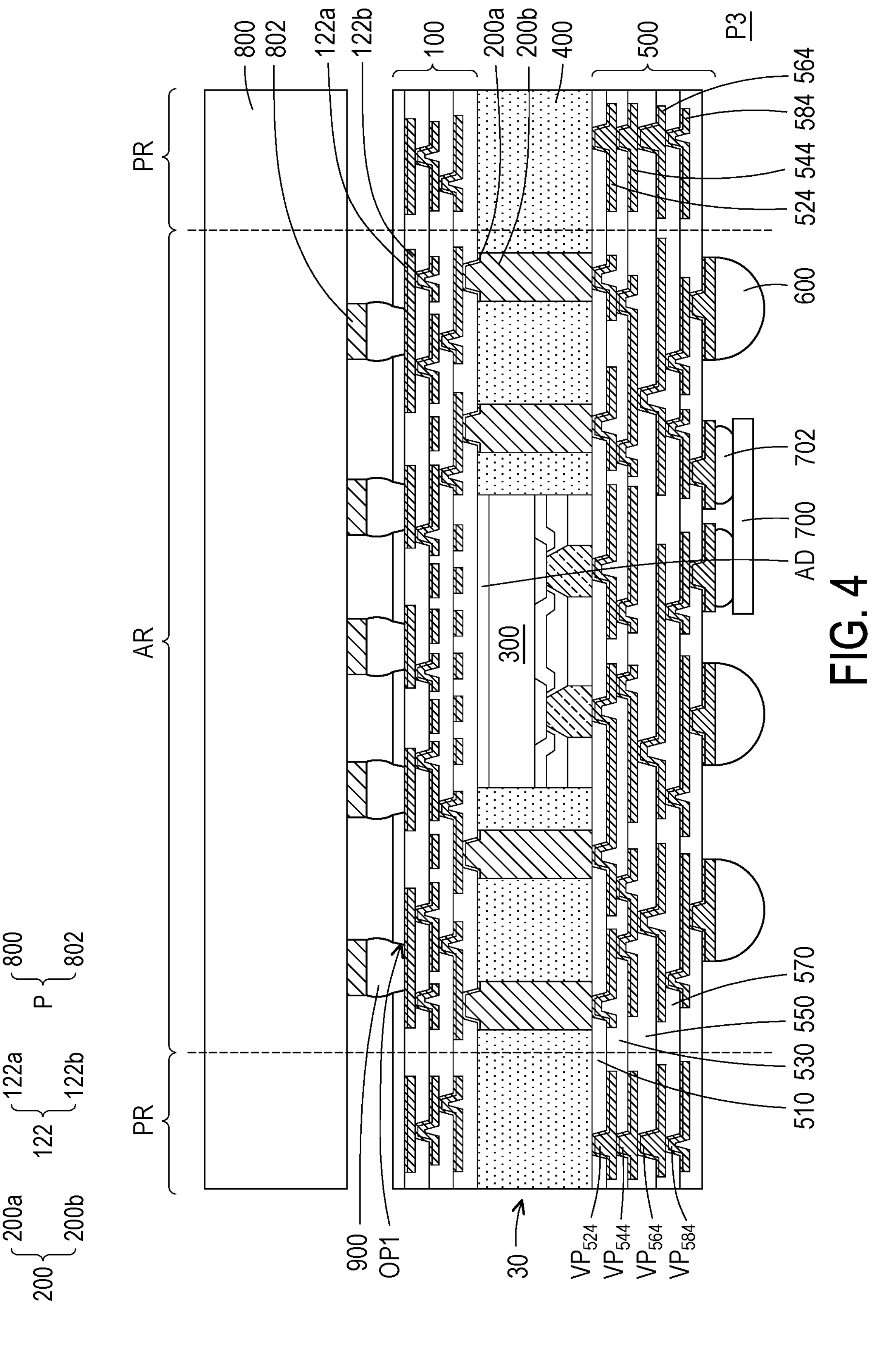
FIG. 4 is a schematic cross-sectional view illustrating a PoP structure in accordance with some alternative embodiments of the disclosure.

FIG. 4 is a schematic cross-sectional view illustrating a PoP structure P3 in accordance with some alternative embodiments of the disclosure. Referring to FIG. 4, the PoP structure P3 in FIG. 4 is similar to the PoP structure P1 in FIG. 1O, so similar elements are denoted by the same reference numeral and the detailed descriptions thereof are omitted herein. The difference between the PoP structure P3 in FIG. 4 and the PoP structure P1 in FIG. 1O lies in the arrangement of the seal ring patterns 524, 544, 564, and 584. In some embodiments, the seal ring pattern 524 has a via portion $VP_{524}$ penetrating through the dielectric layer 510. Similarly, the seal ring pattern 544 has a via portion $VP_{544}$ penetrating through the dielectric layer 530. Moreover, the seal ring pattern 564 has a via portion $VP_{564}$ penetrating through the dielectric layer 550. Furthermore, the seal ring pattern 584 has a via portion $VP_{584}$ penetrating through the dielectric layer 570. As illustrated in FIG. 4, the via portion $VP_{524}$ of the seal ring pattern 524, the via portion $VP_{544}$ of the seal ring pattern 544, the via portion $VP_{564}$ of the seal ring pattern 564, and the via portion $VP_{584}$ of the seal ring pattern 584 are aligned along an extending direction of these via portions $VP_{524}$, $VP_{544}$, $VP_{564}$, $VP_{584}$. In other words, the via portion $VP_{524}$ of the seal ring pattern 524, the via portion $VP_{544}$ of the seal ring pattern 544, the via portion $VP_{564}$ of the seal ring pattern 564, and the via portion $VP_{584}$ of the seal ring pattern 584 are aligned in the cross-sectional view shown in FIG. 4. Throughout the entire disclosure, the extending direction of the via portions $VP_{524}$, $VP_{544}$, $VP_{564}$, $VP_{584}$ refers to a direction perpendicular to an interface between the redistribution structure 500 and the encapsulant 400.

In some embodiments, since the seal ring structure SRS is embedded in both the redistribution structure 100 and the redistribution structure 500, the mechanical strength of the redistribution structures 100 and 500 may be sufficiently enhanced. In other words, the structure rigidity of the redistribution structures 100 and 500 is sufficient to withstand the subsequent high temperature processes (such as reflow process or the like). As such, crack, delamination, and warpage issues of the redistribution structures 100 and 500 may be effectively alleviated, and the reliability of the integrated fan-out package 30 and POP structure P3 may be ensured.

Figure 5:
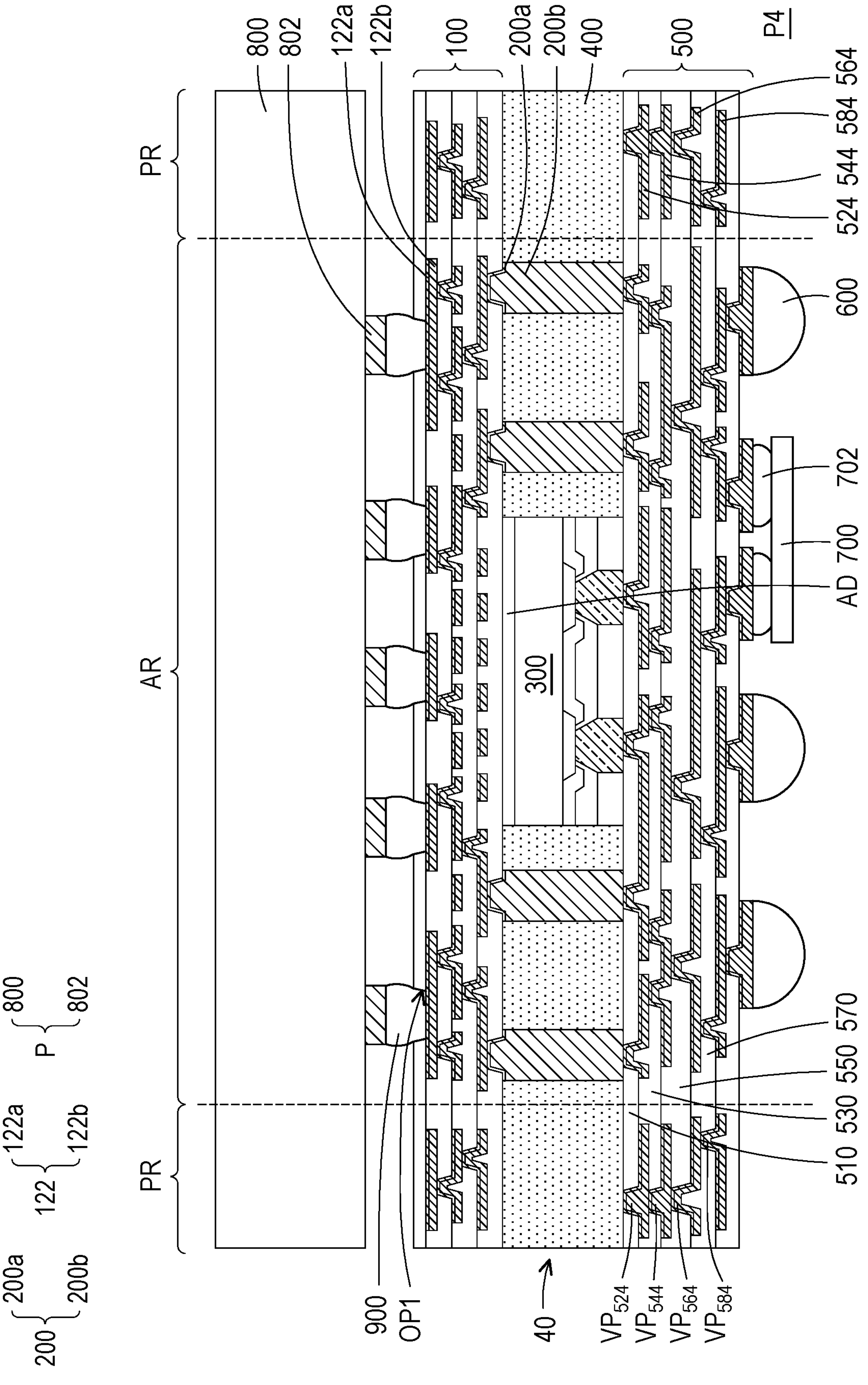
FIG. 5 is a schematic cross-sectional view illustrating a PoP structure in accordance with some alternative embodiments of the disclosure.

FIG. 5 is a schematic cross-sectional view illustrating a PoP structure P4 in accordance with some alternative embodiments of the disclosure. Referring to FIG. 5, the PoP structure P4 in FIG. 5 is similar to the PoP structure P3 in FIG. 4, so similar elements are denoted by the same reference numeral and the detailed descriptions thereof are omitted herein. The difference between the PoP structure P4 in FIG. 5 and the PoP structure P3 in FIG. 4 lies in the arrangement of the seal ring patterns 524, 544, 564, and 584. In some embodiments, the seal ring pattern 524 has a via portion $VP_{524}$ penetrating through the dielectric layer 510. Similarly, the seal ring pattern 544 has a via portion $VP_{544}$ penetrating through the dielectric layer 530. Moreover, the seal ring pattern 564 has a via portion $VP_{564}$ penetrating through the dielectric layer 550. Furthermore, the seal ring pattern 584 has a via portion $VP_{584}$ penetrating through the dielectric layer 570. As illustrated in FIG. 4, the via portion $VP_{524}$ of the seal ring pattern 524, the via portion $VP_{544}$ of the seal ring pattern 544, and the via portion $VP_{564}$ of the seal ring pattern 564 are aligned along an extending direction of these via portions $VP_{524}$, $VP_{544}$, $VP_{564}$. In other words, the via portion $VP_{524}$ of the seal ring pattern 524, the via portion $VP_{544}$ of the seal ring pattern 544, and the via portion $VP_{564}$ of the seal ring pattern 564 are aligned in the cross-sectional view shown in FIG. 5. On the other hand, the via portion $VP_{584}$ of the seal ring pattern 584 is misaligned with the via portion $VP_{524}$ of the seal ring pattern 524, the via portion $VP_{544}$ of the seal ring pattern 544, and the via portion $VP_{564}$ of the seal ring pattern 564 along the extending direction of these via portions $VP_{524}$, $VP_{544}$, $VP_{564}$, $VP_{584}$. In other words, the via portion $VP_{584}$ of the seal ring pattern 584 is misaligned with the via portion $VP_{524}$ of the seal ring pattern 524, the via portion $VP_{544}$ of the seal ring pattern 544, and the via portion $VP_{564}$ of the seal ring pattern 564 in the cross-sectional view shown in FIG. 5. That is, the via portion $VP_{584}$ of the seal ring pattern 584 and the via portion $VP_{564}$ of the seal ring pattern 564 are staggered from the top view. Similarly, the via portion $_{584}$ of the seal ring pattern 584 and the via portion $VP_{544}$ of the seal ring pattern 544 are staggered from the top view, and the via portion $_{584}$ of the seal ring pattern 584 and the via portion $VP_{524}$ of the seal ring pattern 524 are staggered from the top view.

It should be noted that although FIG. 5 depicted only one via portion (i.e. the via portion $VP_{584}$ of the seal ring pattern 584) is misaligned with the rest of the via portions, the disclosure is not limited thereto. In some alternative embodiments, more than one via portions may be misaligned with the rest of the via portions.

In some embodiments, since the seal ring structure SRS is embedded in both the redistribution structure 100 and the redistribution structure 500, the mechanical strength of the redistribution structures 100 and 500 may be sufficiently enhanced. In other words, the structure rigidity of the redistribution structures 100 and 500 is sufficient to withstand the subsequent high temperature processes (such as reflow process or the like). As such, crack, delamination, and warpage issues of the redistribution structures 100 and 500 may be effectively alleviated, and the reliability of the integrated fan-out package 40 and POP structure P4 may be ensured.

Figure 6:
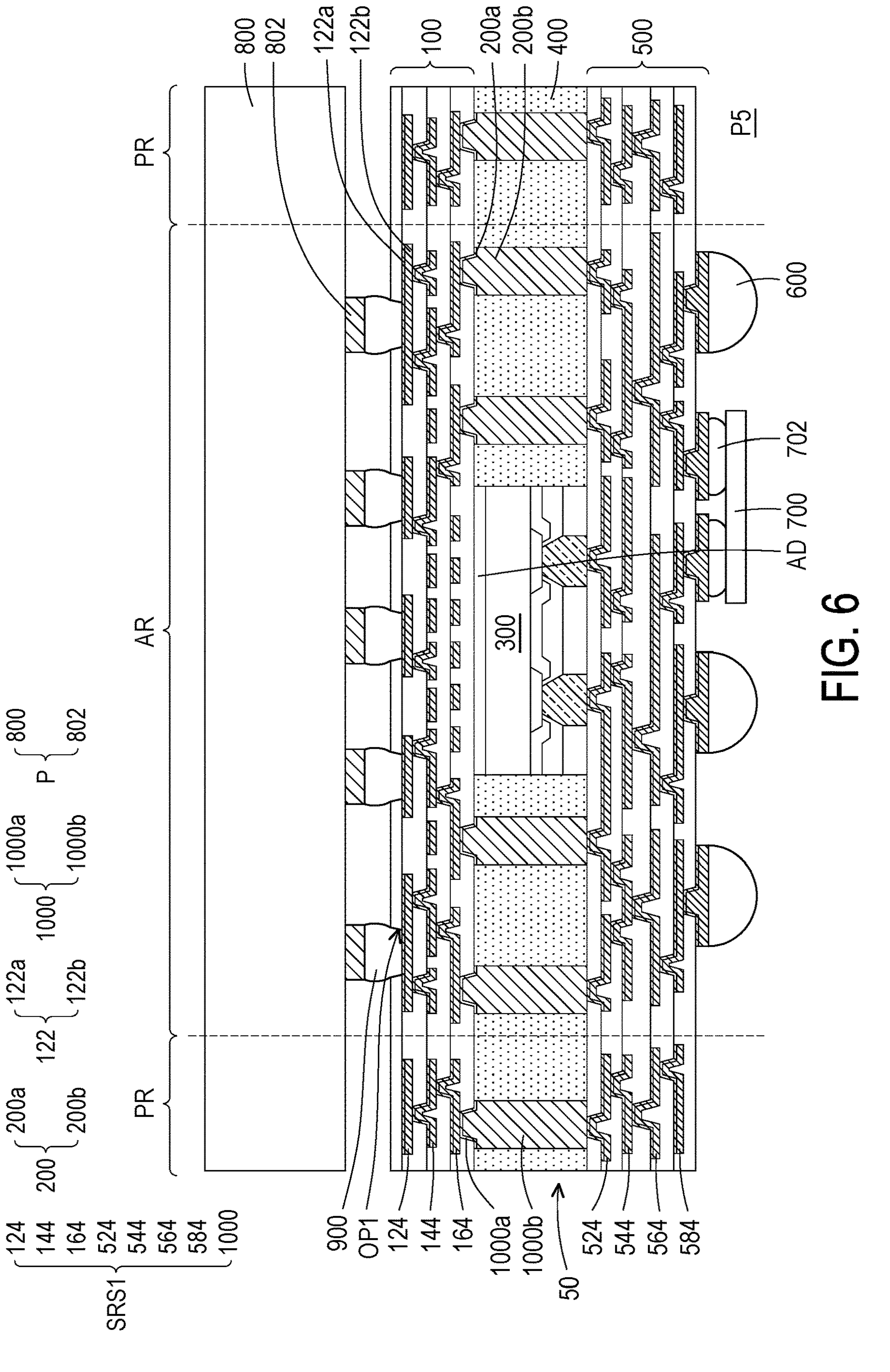
FIG. 6 is a schematic cross-sectional view illustrating a PoP structure in accordance with some alternative embodiments of the disclosure.

FIG. 6 is a schematic cross-sectional view illustrating a PoP structure P5 in accordance with some alternative embodiments of the disclosure. Referring to FIG. 6, the POP structure P5 in FIG. 6 is similar to the PoP structure P1 in FIG. 1O, so similar elements are denoted by the same reference numeral and the detailed descriptions thereof are omitted herein. The difference between the PoP structure P5 in FIG. 6 and the PoP structure P1 in FIG. 1O lies in that the integrated fan-out package 50 in FIG. 6 further includes reinforcement structures 1000.

In some embodiments, each of the reinforcement structures 1000 includes a seed layer **1000*a* and a conductive layer 1000*b* disposed on the seed layer 1000*a*. In some embodiments, the seed layer 1000*a* and the conductive layer 1000*b* of the reinforcement structure 1000 in FIG. 6 are respectively similar to the seed layer 200*a* and the conductive layer 200*b* of the conductive structure 200 in FIG. 1H, so the detailed descriptions thereof are omitted herein. In some embodiments, the reinforcement structures 1000 and the conductive structures 200** are simultaneously formed during the same process.

In some embodiments, the reinforcement structures 1000 are disposed in the peripheral region PR. As illustrated in FIG. 6, the reinforcement structures 1000 penetrate through the encapsulant 400 to connect the seal ring patterns 124, 144, 164, 524, 544, 564, and 584. In some embodiments, the reinforcement structures 1000 are completely located within spans of the seal ring patterns 124, 144, 164, 524, 544, 564, and 584 from the top view. In some embodiments, the seal ring patterns 124, 144, 164, 524, 544, 564, 584 and the reinforcement structures 1000 are collectively referred to as a seal ring structure SRS1. In some embodiments, the seal ring patterns 524, 544, 564, and 584 are referred to as a first portion of the seal ring structure SRS1. Meanwhile, the seal ring patterns 124, 144, and 164 are referred to as a second portion of the seal ring structure SRS1. Moreover, the reinforcement structures 1000 are referred to as a third portion of the seal ring structure SRS1. In other words, the third portion of the seal ring structure SRS1 connects the first portion and the second portion of the seal ring structure SRS1. As such, the seal ring structure SRS1 may be considered as a continuous structure in a cross-sectional view, as shown in FIG. 6.

In some embodiments, since the seal ring structure SRS1 is embedded in the redistribution structure 100, the encapsulant 400, and the redistribution structure 500, the mechanical strength of the redistribution structures 100 and 500 may be sufficiently enhanced. In other words, the structure rigidity of the redistribution structures 100 and 500 is sufficient to withstand the subsequent high temperature processes (such as reflow process or the like). As such, crack, delamination, and warpage issues of the redistribution structures 100 and 500 may be effectively alleviated, and the reliability of the integrated fan-out package 50 and PoP structure P5 may be ensured.

Figure 7:
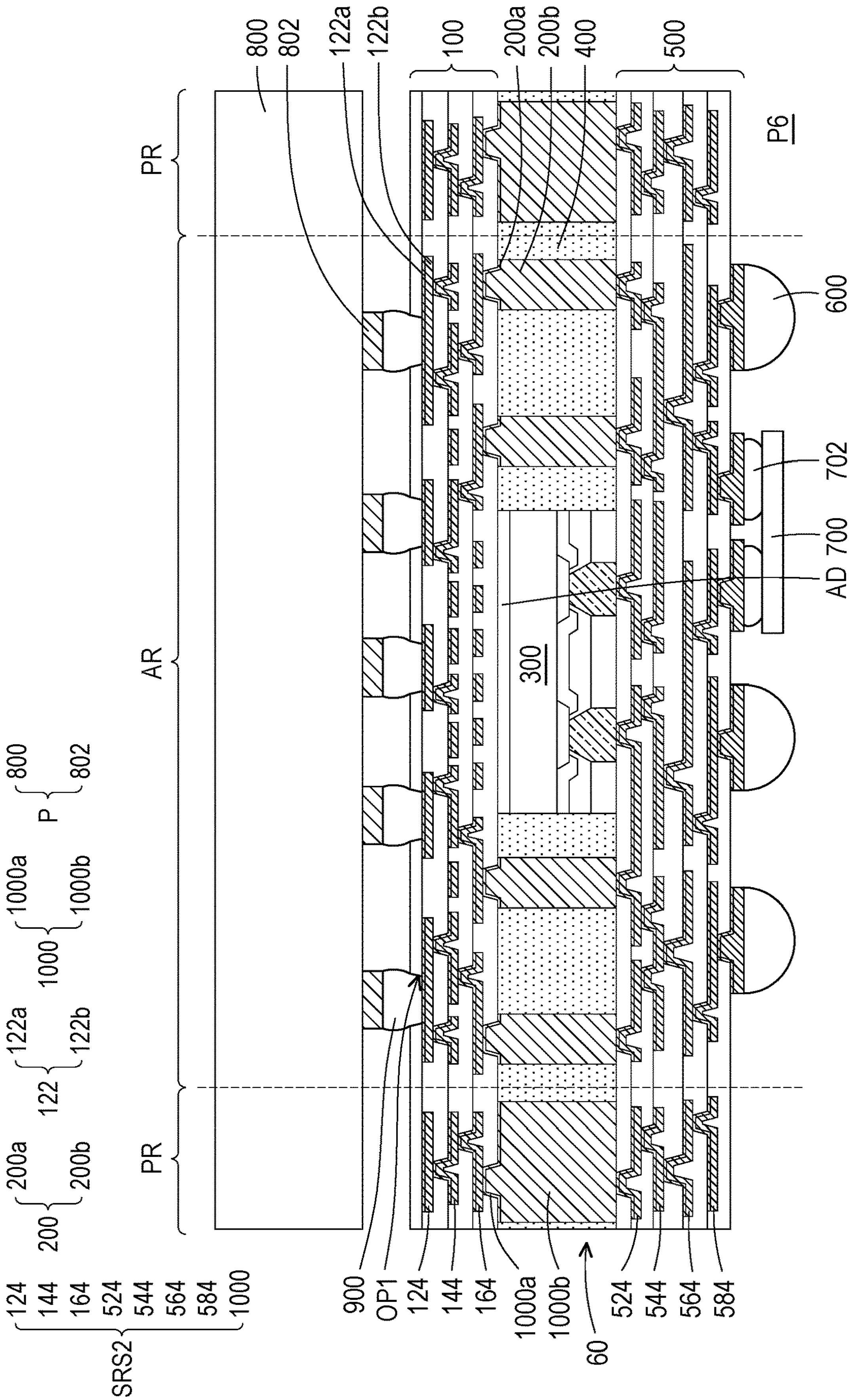
FIG. 7 is a schematic cross-sectional view illustrating a PoP structure in accordance with some alternative embodiments of the disclosure.

FIG. 7 is a schematic cross-sectional view illustrating a PoP structure P6 in accordance with some alternative embodiments of the disclosure. Referring to FIG. 7, the PoP structure P6 in FIG. 7 is similar to the PoP structure P5 in FIG. 6, so similar elements are denoted by the same reference numeral and the detailed descriptions thereof are omitted herein. The difference between the PoP structure P6 in FIG. 7 and the PoP structure P5 in FIG. 6 lies in the dimension of the reinforcement structures 1000.

In some embodiments, each of the reinforcement structures 1000 includes a seed layer **1000*a* and a conductive layer 1000*b* disposed on the seed layer 1000*a*. In some embodiments, the seed layer 1000*a* and the conductive layer 1000*b* of the reinforcement structure 1000 in FIG. 7 are respectively similar to the seed layer 200*a* and the conductive layer 200*b* of the conductive structure 200 in FIG. 1H, so the detailed descriptions thereof are omitted herein. In some embodiments, the reinforcement structures 1000 and the conductive structures 200** are simultaneously formed during the same process.

In some embodiments, the reinforcement structures 1000 are disposed in the peripheral region PR. As illustrated in FIG. 7, the reinforcement structures 1000 penetrate through the encapsulant 400 to connect the seal ring patterns 124, 144, 164, 524, 544, 564, and 584. In some embodiments, the seal ring patterns 124, 144, 164, 524, 544, 564, and 584 are completely located within spans of the reinforcement structures 1000. In some embodiments, the seal ring patterns 124, 144, 164, 524, 544, 564, 584 and the reinforcement structures 1000 are collectively referred to as a seal ring structure SRS2. In some embodiments, the seal ring patterns 524, 544, 564, and 584 are referred to as a first portion of the seal ring structure SRS2. Meanwhile, the seal ring patterns 124, 144, and 164 are referred to as a second portion of the seal ring structure SRS2. Moreover, the reinforcement structures 1000 are referred to as a third portion of the seal ring structure SRS2. In other words, the third portion of the seal ring structure SRS2 connects the first portion and the second portion of the seal ring structure SRS2. As such, the seal ring structure SRS2 may be considered as a continuous structure in a cross-sectional view, as shown in FIG. 7.

In some embodiments, since the seal ring structure SRS2 is embedded in the redistribution structure 100, the encapsulant 400, and the redistribution structure 500, the mechanical strength of the redistribution structures 100 and 500 may be sufficiently enhanced. In other words, the structure rigidity of the redistribution structures 100 and 500 is sufficient to withstand the subsequent high temperature processes (such as reflow process or the like). As such, crack, delamination, and warpage issues of the redistribution structures 100 and 500 may be effectively alleviated, and the reliability of the integrated fan-out package 60 and PoP structure P6 may be ensured.

In accordance with some embodiments of the disclosure, a package structure includes a first package. The first package has an active region and a peripheral region surrounding the active region. The first package includes a first redistribution structure, a second redistribution structure, a die, an encapsulant, and a seal ring structure. The second redistribution structure is disposed over the first redistribution structure. The die is disposed in the active region and is located between the first redistribution structure and the second redistribution structure. The encapsulant laterally encapsulates the die. The seal ring structure is disposed in the peripheral region. A first portion of the seal ring structure is embedded in the first redistribution structure, and a second portion of the seal ring structure is embedded in the second redistribution structure.

In accordance with some embodiments of the disclosure, a package-on-package (POP) structure includes a first package. The first package has an active region and a peripheral region surrounding the active region. The first package includes a first redistribution structure, a die, an encapsulant, and a second redistribution structure. The first redistribution structure includes first conductive patterns disposed in the active region and first seal ring patterns disposed in the peripheral region. The die is disposed on the first redistribution structure. The die is electrically connected to the first conductive patterns. The encapsulant laterally encapsulates the die. The second redistribution structure is disposed on the die and the encapsulant. The second redistribution structure includes second conductive patterns disposed in the active region and second seal ring patterns disposed in the peripheral region. The first seal ring patterns and the second seal ring patterns are electrically floating.

In accordance with some embodiments of the disclosure, a manufacturing method of an integrated fan-out package having an active region and a peripheral region surrounding the active region includes at least the following steps. A carrier is provided. A first redistribution structure is formed on the carrier. The first redistribution structure is formed by at least the step of forming first conductive patterns in the active region and the step of forming first seal ring patterns in the peripheral region. A die is placed on the first redistribution structure and within the active region. The die is laterally encapsulated by an encapsulant. A second redistribution structure is formed on the die and the encapsulant. The second redistribution structure is formed by at least the step of forming second conductive patterns in the active region and the step of forming second seal ring patterns in the peripheral region. The first seal ring pattern and the second seal ring patterns are electrically floating to form a seal ring structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
- a first package having an active region and a peripheral region surrounding the active region, wherein the first package comprises:
  - a first redistribution structure;
  - a second redistribution structure disposed over the first redistribution structure;
  - a die disposed in the active region, wherein the die is located between the first redistribution structure and the second redistribution structure, and the die is physically separated from the second redistribution structure;
- an encapsulant laterally encapsulating the die; and
- a seal ring structure disposed in the peripheral region, wherein a first portion of the seal ring structure is embedded in the first redistribution structure, a second portion of the seal ring structure is embedded in the second redistribution structure, and a third portion of the seal ring structure penetrates through the encapsulant to connect the first portion and the second portion.

2. The package structure of claim 1, wherein the first redistribution structure comprises first dielectric layers and first conductive patterns stacked alternately, the second redistribution structure comprises second dielectric layers and second conductive patterns stacked alternately, the first conductive patterns and the second conductive patterns are located in the active region, and the first conductive patterns, the second conductive patterns, and the die are electrically connected to one another.

3. The package structure of claim 2, further comprising conductive structures penetrating through the encapsulant to electrically connect the first conductive patterns and the second conductive patterns.

4. The package structure of claim 2, wherein the first portion of the seal ring structure comprises first seal ring patterns and the second portion of the seal ring structure comprises second seal ring patterns, the first dielectric layers and the first seal ring patterns are stacked alternately, and the second dielectric layers and the second seal ring patterns are stacked alternately.

5. The package structure of claim 4, wherein the third portion connects the first seal ring patterns and the second seal ring patterns.

6. The package structure of claim 4, wherein the first seal ring patterns and the second seal ring patterns are electrically floating.

7. The package structure of claim 4, wherein a top surface of the topmost second dielectric layer is coplanar with a top surface of the topmost second seal ring pattern.

8. The package structure of claim 4, wherein a top surface of the topmost second dielectric layer is located at a level height higher than that of a top surface of the topmost second seal ring pattern.

9. The package structure of claim 4, wherein each of the first seal ring patterns comprises a via portion penetrating through the corresponding first dielectric layer, and the via portions of each of the first seal ring patterns are aligned along an extending direction of the via portions.

10. The package of structure claim 4, wherein each of the first seal ring patterns comprises a via portion penetrating through the corresponding first dielectric layer, and the via portion of at least one of the first seal ring patterns is misaligned with the via portions of the rest of the first seal ring patterns along an extending direction of the via portions.

11. The package structure of claim 4, wherein each of the second seal ring patterns comprises a seed layer and a conductive layer disposed on the seed layer, and a material of the seed layer of the topmost second seal ring pattern is different from a material of the seed layer of the rest of the second seal ring patterns.

12. The package structure of claim 1, further comprising a second package stacked on the first package, wherein the second package is electrically connected to the second redistribution structure.

13. A package-on-package (PoP) structure, comprising:

a first package having an active region and a peripheral region surrounding the active region, comprising:

a first redistribution structure, comprising first conductive patterns disposed in the active region and first seal ring patterns disposed in the peripheral region;

a die disposed on the first redistribution structure, wherein the die is electrically connected to the first conductive patterns;

an encapsulant laterally encapsulating the die;

a second redistribution structure disposed on the die and the encapsulant, wherein the second redistribution structure comprises second conductive patterns disposed in the active region and second seal ring patterns disposed in the peripheral region, the first seal ring patterns and the second seal ring patterns are electrically floating, and the die is physically separated from the second redistribution structure; and reinforcement structures penetrating through the encapsulant, wherein the reinforcement structures are disposed in the peripheral region to connect the first seal ring patterns and the second seal ring patterns.

14. The POP structure of claim 13, wherein the first package further comprises conductive structures penetrating through the encapsulant, and the conductive structures are disposed in the active region to electrically connect the first conductive patterns and the second conductive patterns.

15. The PoP structure of claim 13, wherein each of the second seal ring patterns comprises a seed layer and a conductive layer disposed on the seed layer, a material of the seed layer of the topmost second seal ring pattern comprises nickel, and a material of the seed layer of the rest of the second seal ring patterns comprises titanium.

16. The POP structure of claim 13, wherein each of the first seal ring patterns comprises a via portion, and the via portions of at least two of the first seal ring patterns are staggered.

17. The POP structure of claim 13, further comprising a second package stacked on the first package, wherein the second package is electrically connected to the second redistribution structure, the second package is attached to the first package through connectors, and the connectors are partially embedded in the second redistribution structure.

18. A manufacturing method of an integrated fan-out package having an active region and a peripheral region surrounding the active region, comprising:

providing a carrier;

forming a first redistribution structure on the carrier, comprising:

forming first conductive patterns in the active region; and forming first seal ring patterns in the peripheral region;

placing a die on the first redistribution structure and within the active region, wherein the die is electrically connected to the first conductive patterns, and the die is physically separated from the first redistribution structure;

laterally encapsulating the die by an encapsulant;

forming reinforcement structures penetrating through the encapsulant, wherein the reinforcement structures are disposed in the peripheral region; and forming a second redistribution structure on the die and the encapsulant, comprising:

forming second conductive patterns in the active region; and forming second seal ring patterns in the peripheral region, wherein the reinforcement structures connect the first seal ring patterns and the second seal ring patterns, and the first seal ring pattern, the second seal ring patterns, and the reinforcement structures are electrically floating to form a seal ring structure.

19. The method of claim 18, wherein the first conductive patterns and the first seal ring patterns are formed simultaneously.

20. The method of claim 18, further comprising forming conductive structures penetrating through the encapsulant, wherein the conductive structures and the reinforcement structures are simultaneously formed.

* * * * *